United States Patent
Song et al.

(10) Patent No.: US 11,989,091 B2
(45) Date of Patent: May 21, 2024

(54) MEMORY SYSTEM FOR PERFORMING RECOVERY OPERATION, MEMORY DEVICE, AND METHOD OF OPERATING THE SAME

(71) Applicant: SAMSUNG ELECTRONICS CO., LTD., Suwon-si (KR)

(72) Inventors: Younggul Song, Suwon-sl (KR); Byungchul Jang, Suwon-si (KR); Junyeong Seok, Suwon-si (KR); Eun Chu Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 42 days.

(21) Appl. No.: 17/965,091

(22) Filed: Oct. 13, 2022

(65) Prior Publication Data

US 2023/0153202 A1 May 18, 2023

(30) Foreign Application Priority Data

Nov. 12, 2021 (KR) .................. 10-2021-0156056
May 3, 2022 (KR) .................. 10-2022-0055022

(51) Int. Cl.
G06F 11/10 (2006.01)
G06F 11/07 (2006.01)

(52) U.S. Cl.
CPC ........ *G06F 11/1068* (2013.01); *G06F 11/076* (2013.01); *G06F 11/0793* (2013.01)

(58) Field of Classification Search
None
See application file for complete search history.

(56) References Cited

U.S. PATENT DOCUMENTS 7,983,092 B2   7/2011   Chang et al.
8,488,387 B2   7/2013   Lue et al.
(Continued)

FOREIGN PATENT DOCUMENTS

JP   2006-196650   7/2006

OTHER PUBLICATIONS

A. Silvagni, G. Fusillo, R. Ravasio, M. Picca and S. Zanardi, "An overview of logic architectures inside flash memory devices, " in Proceedings of the IEEE, vol. 91, No. 4, pp. 569-580, Apr. 2003, doi: 10.1109/JPROC.2003.811707. (Year: 2003).*

(Continued)

*Primary Examiner* — Daniel F. McMahon
(74) *Attorney, Agent, or Firm* — F. Chau & Associates, LLC

(57) ABSTRACT

A method of operating a memory system that comprises a memory device including a plurality of memory blocks and a memory controller, includes detecting a first memory block having a degradation count greater than or equal to a first reference value by the memory controller. A first command for the first memory block is transmitted to the memory device by the memory controller. A first voltage is applied to all of a plurality of word lines connected to the first memory block and a second voltage to a bit line connected to the first memory block in response to the first command by the memory device. The first voltage is greater than a voltage applied to turn on memory cells connected to all of the plurality of word lines. The second voltage is greater than a voltage applied to the bit line during program, read or erase operations.

20 Claims, 27 Drawing Sheets

(56) References Cited

U.S. PATENT DOCUMENTS

| | | | |
|---|---|---|---|
| 9,202,572 B2 | 12/2015 | Bronner et al. | |
| 9,455,038 B2 | 9/2016 | Tuers et al. | |
| 10,916,308 B2 | 2/2021 | Lue | |
| 2010/0025811 A1 | 2/2010 | Bronner et al. | |
| 2012/0151301 A1* | 6/2012 | Izumi | H03M 13/2909 |
| | | | 714/763 |
| 2012/0275232 A1* | 11/2012 | Park | G11C 16/0483 |
| | | | 365/185.24 |
| 2017/0329556 A1* | 11/2017 | Hirano | G06F 11/0751 |
| 2019/0115083 A1* | 4/2019 | Lee | G11C 11/5642 |
| 2020/0409788 A1* | 12/2020 | Kurose | G11C 16/0483 |
| 2022/0328100 A1* | 10/2022 | Choi | G11C 11/5628 |

OTHER PUBLICATIONS

Moon et al., "Sustainable Electronics for Nano-Spacecraft in Deep Space Missions", Conference: 2016 IEEE International Electron Devices Meeting (IEDM), pp. IEDM16-794-IEDM16-797.

Hur et al., "A Recoverable Synapse Device Using a Three-Dimensional Silicon Transistor", Adv. Funct. Mater. 2018, 10 pages.

\* cited by examiner

MEMORY SYSTEM FOR PERFORMING RECOVERY OPERATION, MEMORY DEVICE, AND METHOD OF OPERATING THE SAME

CROSS-REFERENCE TO RELATED APPLICATIONS

This application claims priority under 35 U.S.C. § 119 to Korean Patent Application No. 10-2021-0156056, filed on Nov. 12, 2021 in the Korean Intellectual Property Office and Korean Patent Application No. 10-2022-0055022, filed on May 3, 2022 in the Korean Intellectual Property Office, the disclosures of which are incorporated by reference in their entireties herein.

1. TECHNICAL FIELD

The present inventive concept relates to a memory system, and more particularly, to a memory system for performing a recovery operation, a memory device, and a method of operating them.

2. DISCUSSION OF RELATED ART

A non-volatile memory device is a semiconductor memory device that includes a plurality of memory cells having non-volatile store data. As an example of a non-volatile memory device, a flash memory system is widely applied to various electronic devices, such as a universal serial bus (USB) drive, a digital camera, a mobile phone, a smart phone, a tablet personal computer (PC), a memory card, and a solid state drive (SSD). It is desirable for a memory system that includes a non-volatile memory device to have an increased reliability of programmed data while enabling a large capacity storage.

SUMMARY

Embodiments of the present inventive concept provide a memory device for performing a recovery operation to reduce degradation of the reliability of the memory device on which program/erase operations are repeatedly performed. Embodiments of the present inventive concept provide a memory device that cures itself by using Joule heat generated as a current flowing in the memory device, a memory system including the same, and a method of operating the same.

According to an embodiment of the present inventive concept, a method of operating a memory system that comprises a memory device including a plurality of memory blocks and a memory controller, includes detecting a first memory block having a degradation count greater than or equal to a first reference value from among the plurality of memory blocks by the memory controller. A first command for the first memory block is transmitted to the memory device by the memory controller. A recovery operation is performed by applying a first voltage to all of a plurality of word lines connected to the first memory block and a second voltage to a bit line connected to the first memory block in response to the first command by the memory device. The first voltage is greater than a voltage applied to turn on memory cells connected to all of the plurality of word lines connected to the first memory block. The second voltage is greater than a voltage applied to the bit line during a program operation, a read operation, or an erase operation performed on the memory device.

According to an embodiment of the present inventive concept, a memory device includes a memory cell array comprising a plurality of memory blocks. Each of the plurality of memory blocks comprises a plurality of memory cells, a plurality of word lines respectively connected to the plurality of memory blocks, and a plurality of bit lines respectively connected to the plurality of memory blocks. A control circuit controls the memory device to perform a control operation on a first memory block from among the plurality of memory blocks. During the control operation, the control circuit copies first data stored on the first memory block from among the plurality of memory blocks and stores the first data on a second memory block from among the plurality of memory blocks and erases the first data stored on the first memory block; applies a first voltage to some selected word lines from among a plurality of word lines connected to the first memory block and applies a second voltage to a bit line connected to the first memory block among the plurality of bit lines; controls the first voltage to be greater than a voltage applied to turn on memory cells connected to the some selected word lines from among the word lines connected to the first memory block; and controls the second voltage to be greater than a voltage applied to the bit line during a program operation, a read operation, or an erase operation performed on the memory cell array.

According to an embodiment of the present inventive concept, a memory system includes a memory device comprising a plurality of memory blocks. A memory controller transmits commands to control the memory device. In response to the commands, the memory device copies first data stored on a first memory block from among the plurality of memory blocks and stores the first data on a second memory block from among the plurality of memory blocks, erases the first data stored on the first memory block, applies a first voltage to all of word lines connected to the first memory block, and applies a second voltage to a bit line connected to the first memory block. The first voltage is greater than a voltage applied to turn on memory cells connected to all of the word lines connected to the first memory block. The second voltage is greater than a voltage applied to the bit line during a pre-charging operation for the memory device.

BRIEF DESCRIPTION OF THE DRAWINGS

Embodiments of the present inventive concept will be more clearly understood from the following detailed description taken in conjunction with the accompanying drawings in which.

DETAILED DESCRIPTION OF EMBODIMENTS

Figure 1:
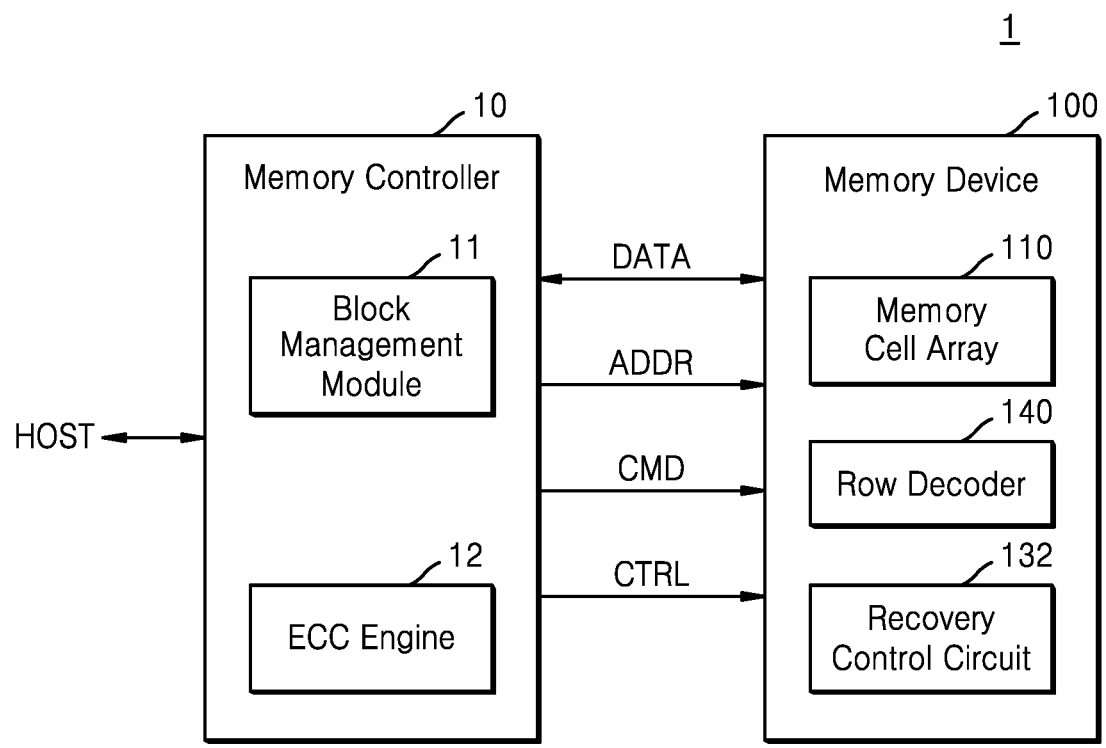
FIG. 1 is a block diagram showing a memory system according to an embodiment of the present inventive concept.

FIG. 1 is a block diagram showing a memory system according to an embodiment of the present inventive concept. Referring to FIG. 1, a memory system 1 may include a memory controller 10 and a memory device 100. The memory controller 10 may include a block management module 11 and an error correction code (ECC) engine 12. The memory device 100 may include a memory cell array 110, a row decoder 140, and a recovery control circuit 132.

According to some embodiments, the memory system 1 may be implemented as an internal memory embedded in (e.g., applied to) an electronic device, such as an embedded universal flash storage (UFS) memory device, an embedded multi-media card (eMMC), or a solid state drive (SSD). According to some embodiments, the memory system 1 may be implemented as an external memory that is detachably attached to an electronic device, such as a UFS memory card, a compact flash (CF) memory card, a secure digital (SD) memory card, a micro secure digital (micro-SD) memory card, a mini secure digital (mini-SD) memory card, an extreme digital (xD) memory card, or a memory stick. However, embodiments of the present inventive concept are not necessarily limited thereto.

The memory controller 10 may control the memory device 100 to read data stored in the memory device 100 or to program data to the memory device 100 in response to a write/read request from a host HOST. As program/erase cycles are repeated in each memory block of the memory device 100, the reliability of the memory block may degrade, and the memory controller 10 may control the memory device 100 to recover the degraded reliability of the memory block. For example, the memory controller 10 may provide an address ADDR, a command CMD, and a control signal CTRL to the memory device 100, thereby controlling a program operation, a read operation, an erase operation, and a recovery operation performed on the memory device 100. Also, data DATA to be programmed and read data DATA may be transmitted and received between the memory controller 10 and the memory device 100.

According to an embodiment, as program/erase cycles of a memory block accumulate, the reliability of the memory block may degrade. In an embodiment, to reduce degradation of the reliability of a memory block, the memory system 1 may perform wear leveling management, bad block management, a recovery operation for self-curing, etc. The memory controller 10 may provide an address ADDR, a command CMD, a control signal CTRL, and data DATA for performing wear leveling management, bad block management, and a recovery operation on the memory device 100. Detailed descriptions of the recovery operation are provided below.

In an embodiment, the block management module 11 may include a counter for the degradation count of each memory block of the memory cell array 110. The degradation count may be a program/erase count for a memory block, a read count for a memory block, or the number of error bits of data read from a memory block. However, embodiments of the present inventive concept are not necessarily limited thereto, and the degradation count may be various pieces of information indicating and/or relating to degradation of a memory block.

According to an embodiment, the counter of the block management module 11 may update degradation counts every time an operation that accumulates degradation counts for memory blocks in the memory device 100 is performed. According to an embodiment, a degradation count may increase every time a program/erase operation is performed on a corresponding memory block. According to an embodiment, a degradation count may increase every time a read operation is performed on a corresponding memory block. According to an embodiment, a degradation count may increase when the number of error bits detected when a read operation is performed on a corresponding memory block increases. The value of a degradation count may differ from one memory block to another.

The block management module 11 may compare a first reference value with a degradation count. The memory controller 10 may provide a recovery command and an address of a memory block having a degradation count that is greater than or equal to the first reference value to the memory device 100, and a recovery operation may be performed on the corresponding memory block. The block management module 11 may compare a second reference value with a degradation count. The memory controller 10 may manage a memory block having a degradation count greater than or equal to the second reference value as a bad, block. The first reference value may be less than the second reference value. According to some embodiments, when a degradation count corresponds to the number of error bits, the first reference value may be the maximum number of error bits that may be error-corrected by the ECC engine 12. According to some embodiments, the first reference value may differ from one memory block to another. According to some embodiments, the memory system 1 may further include an additional memory device other than the memory device 100, and the value of the first reference value may differ from one memory device to another.

According to an embodiment, the memory controller 10 may compare a first reference value or a second reference value stored in the block management module 11 with degradation counts, thereby determining whether memory blocks in the memory device 100 are bad blocks and whether a recovery operation for recovering degraded reliability of memory blocks is necessary to be performed.

The ECC engine 12 may be configured to detect and correct an error in data read from the memory device 100 by using an error correction code. The ECC engine 12 may include all of the circuits, systems, or devices for error correction. When the ECC engine 12 performs error correction and the number of errors is greater than an error bit correction threshold, error bit correction may fail.

According to an embodiment, the memory controller 10 may perform a recovery operation based on whether data correction of the ECC engine 12 is successful.

The recovery control circuit 132 may control the memory device 100 to perform a recovery operation in response to a recovery command received from the memory controller 10. According to an embodiment, the recovery control circuit 132 may control the memory device 100 to apply voltages to word lines and bit lines of a memory block to be recovered. For example, a voltage applied to a word line may be greater than or equal to a turn-on voltage for turning on memory cells or a pass voltage. A voltage applied to a bit line may be higher than a voltage applied during a pre-charge operation. According to an embodiment, when the recovery control circuit 132 applies a voltage to word lines, the recovery control circuit 132 may control the memory device 100, such that the voltage is applied to some selected word lines from among a plurality of word lines connected to a memory block to be recovered. According to an embodiment, when the recovery control circuit 132 applies a voltage to word lines, the recovery control circuit 132 may control the memory device 100, such that the voltage is applied to all of a plurality of word lines connected to a memory block to be recovered.

Figure 2:
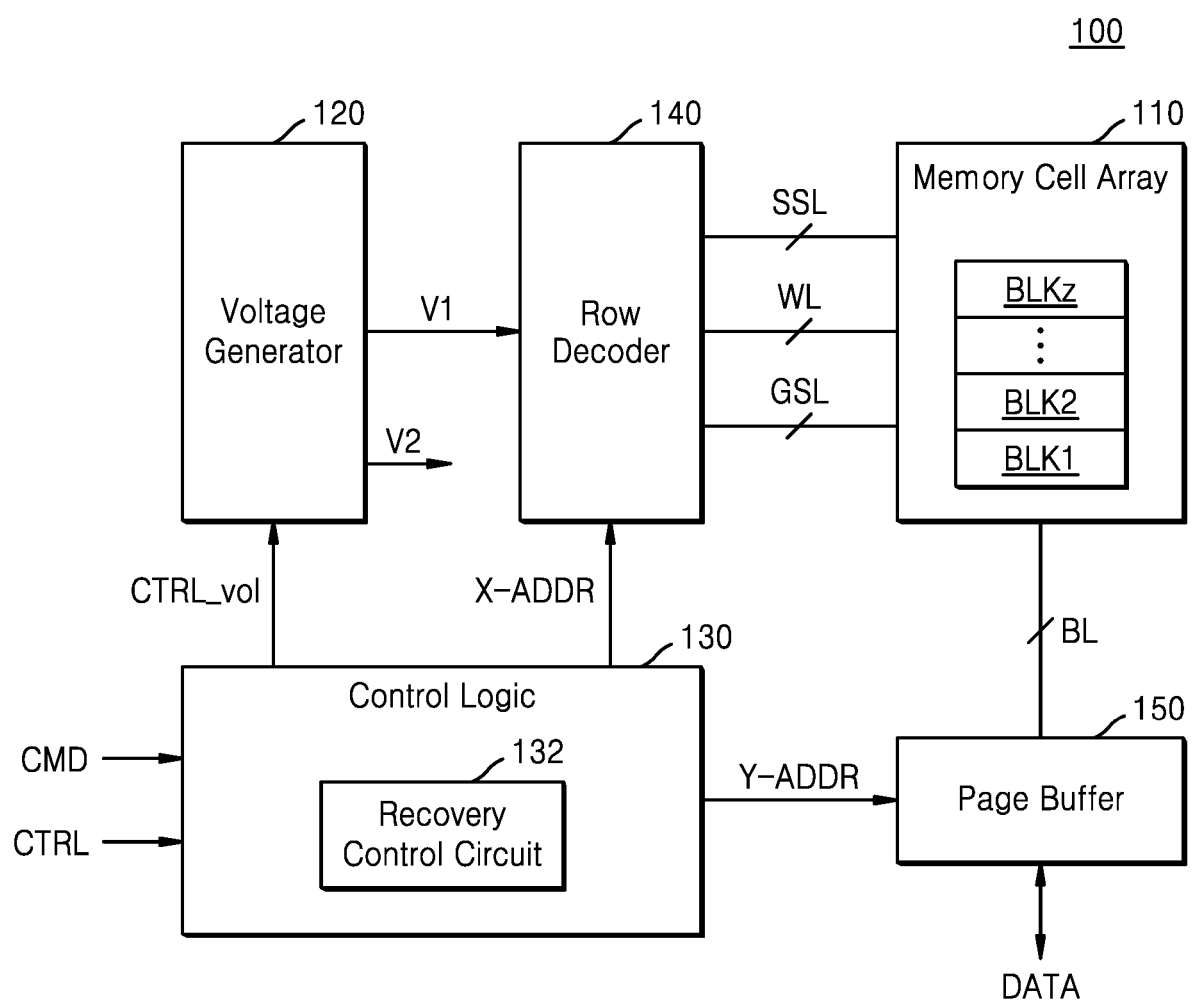
FIG. 2 is a block diagram of a memory device according to an embodiment of the present inventive concept.

FIG. 2 is a block diagram of a memory device according to an embodiment. For example, FIG. 2 may show an example implementation of the memory device 100 of FIG. 1.

Referring to FIG. 2, the memory device 100 may include the memory cell array 110, a voltage generator 120, a control logic 130, the row decoder 140, and a page buffer 150. In an embodiment, the memory device 100 may further include various other components related to a memory operation, such as a data input/output circuit or an input/output interface, etc.

The memory cell array 110 may include a plurality of memory cells and may be connected to word lines WL, string select lines SSL, ground select lines GSL, and bit lines BL. In an embodiment, the memory cell array 110 may be connected to the row decoder 140 through the word lines WL, the string select lines SSL, and the ground select lines GSL and may be connected to the page buffer 150 through the bit lines BL.

For example, the memory cells included in the memory cell array 110 may be non-volatile memory cells that retain stored data even when the supplied power is cut off. For example, in an embodiment in which the memory cells are non-volatile memory cells, the memory device 100 may be electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), or ferroelectric random access memory (FRAM). Hereinafter, embodiments are described in which the memory cells are NAND flash memory cells, but it will be understood that embodiments of the present inventive concept are not necessarily limited thereto.

The memory cell array 110 may include a plurality of memory blocks BLK1 to BLKz, and each memory block may have a planar structure or a 3-dimensional structure. In an embodiment, the memory cell array 110 may include at least one of a single-level cell block including single-level cells (SLCs), a multi-level cell block including multi-level cells (MLCs), a triple-level cell block including triple-level cells (TLCs), and a quad-level cell block including quad-level cells (QLCs). For example, some memory blocks from among the memory blocks BLK1 to BLKz may be single-level cell blocks, and the other memory blocks may be multi-level cell blocks, triple-level cell blocks, or quad-level cell blocks.

The voltage generator 120 may generate various voltages used in the memory device 100, such as a program voltage provided to a selected word line for a program operation, a pass voltage provided to an unselected word line, a string select voltage provided to the string select lines SSL and a ground select voltage provided to the ground select lines GSL.

According to an embodiment, the voltage generator 120 may generate a first voltage V1 provided to word lines of a memory block to be recovered during a recovery operation of the memory device 100. For example, in an embodiment the first voltage V1 may be simultaneously applied to all of word lines connected to a memory block to be recovered. However, embodiments of the present inventive concept are not necessarily limited thereto. For example, in an embodiment the first voltage V1 may be applied only to some selected word lines from among a plurality of word lines connected to a memory block to be recovered. According to an embodiment, the voltage generator 120 may generate a second voltage V2 provided to bit lines connected to a memory block to be recovered. The second voltage V2 may be transmitted to the page buffer 150.

The control logic 130 may output various internal control signals for programming data to the memory cell array 110 or reading data from the memory cell array 110 based on a command CMD, an address ADDR, and a control signal CTRL received from the memory controller 10. For example, the control logic 130 may output a voltage control signal CTRL_vol for controlling levels of various voltages generated by the voltage generator 120. According to an embodiment, the control logic 130 may output a control signal for controlling levels of voltages used in a recovery operation for recovering a memory block with degraded reliability.

The control logic 130 may provide a row address X-ADDR to the row decoder 140 and provide a column address Y-ADDR to the page buffer 150.

The row decoder 140 may select at least one of word lines of a selected memory block in response to the row address X-ADDR. According to an embodiment, the row decoder 140 may provide the first voltage V1 to word lines of a memory block to be recovered in response to the row address X-ADDR during a recovery operation.

The page buffer 150 may operate in response to the control of the control logic 130. For example, the page buffer 150 may operate as a write driver or a sense amplifier. According to an embodiment, during a program operation, the page buffer 150 may operate as a write driver and apply a voltage according to data DATA to be stored in the memory cell array 110 to the bit lines BL. According to an embodiment, during a read operation, the page buffer 150 may operate as a sense amplifier and sense data DATA stored in the memory cell array 110. According to an embodiment, during a recovery operation, the page buffer 150 may provide the second voltage V2 to the bit line BL in response to the column address Y-ADDR.

The control logic 130 may include the recovery control circuit 132. However, embodiments of the present inventive concept are not necessarily limited thereto, and the recovery control circuit 132 may be provided outside the control logic 130.

According to an embodiment, the recovery control circuit 132 may control the voltage generator 120, the row decoder 140, and the page buffer 150, such that a recovery operation may be performed on memory blocks with degraded reliability from among a plurality of memory blocks included in the memory cell array 110. For example, a memory block on which a recovery operation is to be performed may be a memory block having a degradation count greater than or equal to the first reference value. The first reference value may differ from one memory block to another. The first reference value may differ from one memory device to another.

The recovery control circuit 132 may perform a recovery operation on a degraded memory block, thereby recovering the data retention characteristic of the degraded memory block.

According to an embodiment, the recovery control circuit 132 may control the voltage generator 120, the row decoder 140, and the page buffer 150 to apply the first voltage V1 to word lines of a memory block and apply the second voltage V2 to bit lines of the memory block to perform a recovery operation on the memory block. The first voltage V1 and the second voltage V2 may be different from each other. For example, the first voltage V1 applied to the word line may be a turn-on voltage for turning on memory cells or a pass voltage. The second voltage V2 applied to bit lines may be a voltage that is higher than voltages applied during a program operation, an erase operation, a read operation, and a pre-charge operation. For example, in an embodiment the first voltage V1 applied to word lines may be a voltage that is higher than a voltage applied during a program operation. The second voltage V2 that is applied to bit lines may be a voltage higher than voltages applied during a program operation, an erase operation, a read operation, and a pre-charge operation.

According to an embodiment, when the recovery control circuit 132 applies a voltage to word lines, the recovery control circuit 132 may control the memory device 100, such that the voltage is applied to some selected word lines from among a plurality of word lines connected to a memory block to be recovered. According to an embodiment, when the recovery control circuit 132 applies a voltage to word lines, the recovery control circuit 132 may control the memory device 100, such that the voltage is applied to all of a plurality of word lines connected to a memory block to be recovered.

Figure 3:
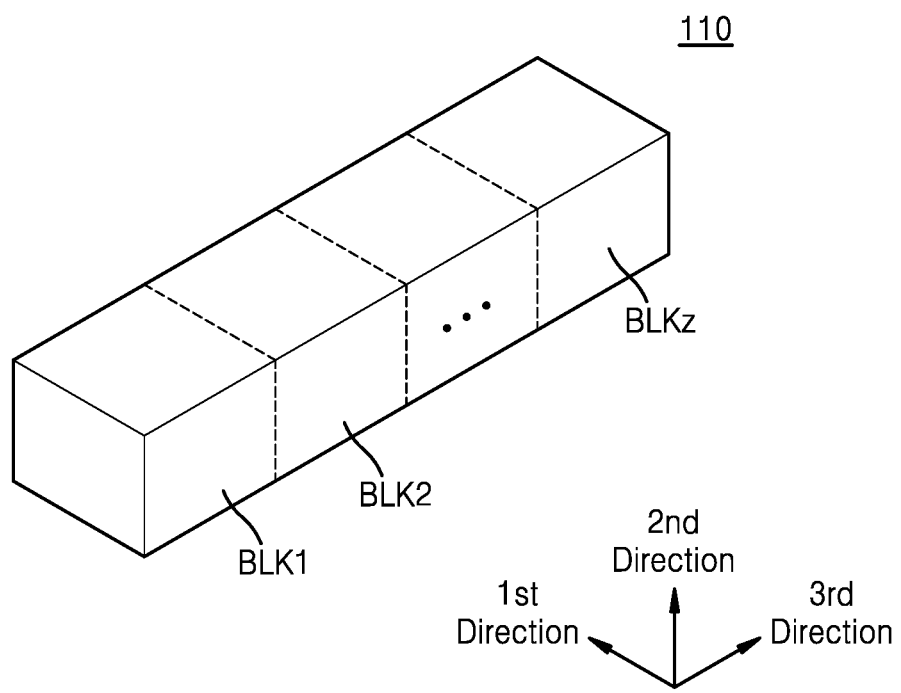
FIG. 3 is a perspective view showing the memory cell array of FIG. 2.

FIG. 3 is a perspective view showing the memory cell array of FIG. 2.

Referring to FIG. 3, the memory cell array 110 includes the memory blocks BLK1 to BLKz. Each memory block BLK has a 3-dimensional structure (e.g., a vertical structure). For example, each memory block BLK may include a structure extending in first to third directions. For example, in an embodiment each memory block BLK includes a plurality of NAND strings (e.g., NS11 to NS31 of FIG. 5) extending in a second direction. For example, a plurality of NAND strings (e.g., NS11 to NS31 of FIG. 5) may be provided in first and third directions.

Each NAND string NS is connected to a bit line BL, a string select line SSL, a ground select line GSL, word lines WL, and a common source line CSL. For example, each memory block may be connected to the bit lines BL, the string select lines SSL, the ground select lines GSL, the word lines WL, and the common source line CSL. The memory blocks BLK1 to BLKz are described in more detail with reference to FIG. 4.

Figure 4:
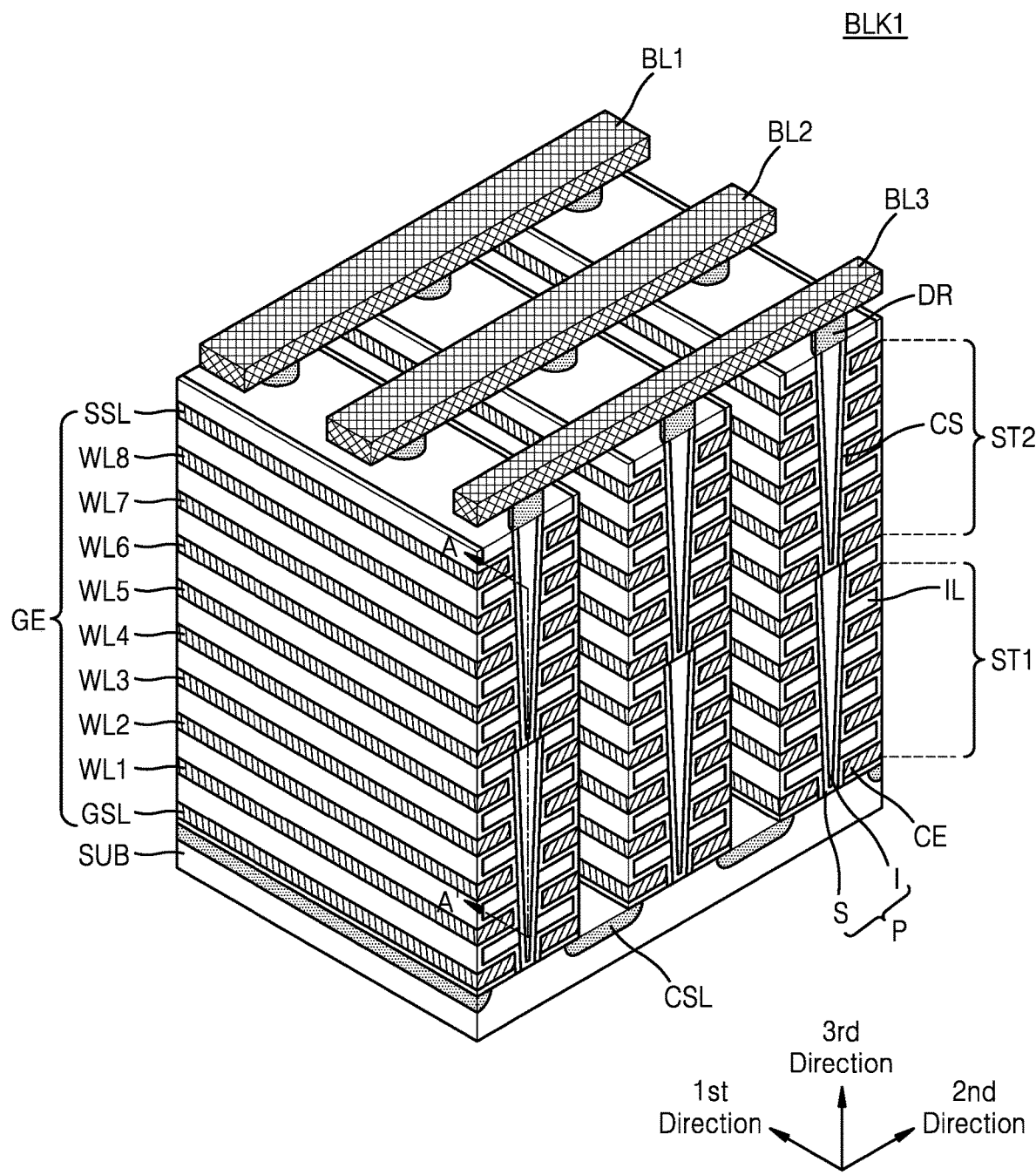
FIG. 4 is a perspective view of a first memory block from among the memory blocks of FIG. 2 according to an embodiment of the present inventive concept.

FIG. 4 is a perspective view of an implementation example of a first memory block from among the memory blocks of FIG. 2.

Referring to FIG. 4, memory blocks included in a memory cell array (e.g., 110 of FIG. 2) are formed in a vertical direction with respect to a substrate SUB. Although FIG. 4 shows that the memory block includes two selection lines GSL and SSL, eight word lines WL1 to WL8, and three bit lines BL1 to BL3, embodiments of the present inventive concept are not necessarily limited thereto and the actual numbers may be less than or greater than the above numbers.

The substrate SUB has a first conductivity type (e.g., a p type), and common source lines CSL that extend in a first direction and are doped with impurities of a second conductivity type (e.g., an n type) are provided in the substrate SUB. In an embodiment, the substrate SUB may include a bulk silicon substrate, a silicon-on-insulator (SOI) substrate, a germanium substrate, a germanium-on-insulator (GOI) substrate, a silicon-germanium substrate, or an epitaxial thin-film substrate obtained by performing a selective epitaxial growth (SEG). The substrate SUB may include a semiconductor material, e.g., silicon (Si), germanium (Ge), silicon germanium (SiGe), gallium arsenide (GaAs), indium gallium arsenide (InGaAs), aluminum gallium arsenide (AlGaAs), or a mixture thereof. However, embodiments of the present inventive concept are not necessarily limited thereto.

A first memory stack ST1 may be provided on the substrate SUB. For example, a plurality of insulation layers IL extending in the first direction are sequentially arranged in a third direction in a region of the substrate SUB between two adjacent common source lines CSL (e.g., in the second direction), and the insulation layers IL are a certain distance apart from each other in the third direction. For example, the insulation layers IL may include an insulating material, such as silicon oxide. A plurality of pillars P, which are sequentially arranged by etching in the first direction and penetrate through the insulation layers IL in the third direction, are provided in the region of the substrate SUB between two adjacent common source lines CSL. For example, the pillars P may contact the substrate SUB by penetrating through the insulation layers IL. In an embodiment, a surface layer S of each pillar may include a silicon-based material doped with impurities of the first conductivity type and function as a channel region. In an embodiment, an internal layer I of each pillar may include an insulating material, such as silicon oxide or an air gap.

A charge storage layer CS is provided along exposed surfaces of the insulation layers IL, the pillars P, and the substrate SUB in the region between the two adjacent common source lines CSL. The charge storage layer CS may include a gate insulation layer (also referred to as a 'tunneling insulation layer'), a charge trapping layer, and a blocking insulation layer. For example, the charge storage layer CS may have an oxide-nitride-oxide (ONO) structure. Also, gate electrodes GE, such as selected gate lines GSL and SSL and word lines WL1 through WL4, are provided on the exposed surface of the charge storage layer CS in the region between the two adjacent common source lines CSL.

In a memory block BLK1 according to an embodiment of the present inventive concept, a second memory stack ST2 formed in the same manner as the first memory stack ST1 may be additionally provided on the first memory stack ST1 (e.g., in the third direction) formed by the above-described manner. Drains or drain contacts DR are respectively provided on the pillars P extending to the second memory stack ST2. For example, the drains or the drain contacts DR may include a silicon-based material doped with impurities of the second conductivity type. Bit lines BL1 to BL3 extending in the second direction and arranged a certain distance apart from one another in the first direction are provided on the drain contacts DR.

Figure 5:
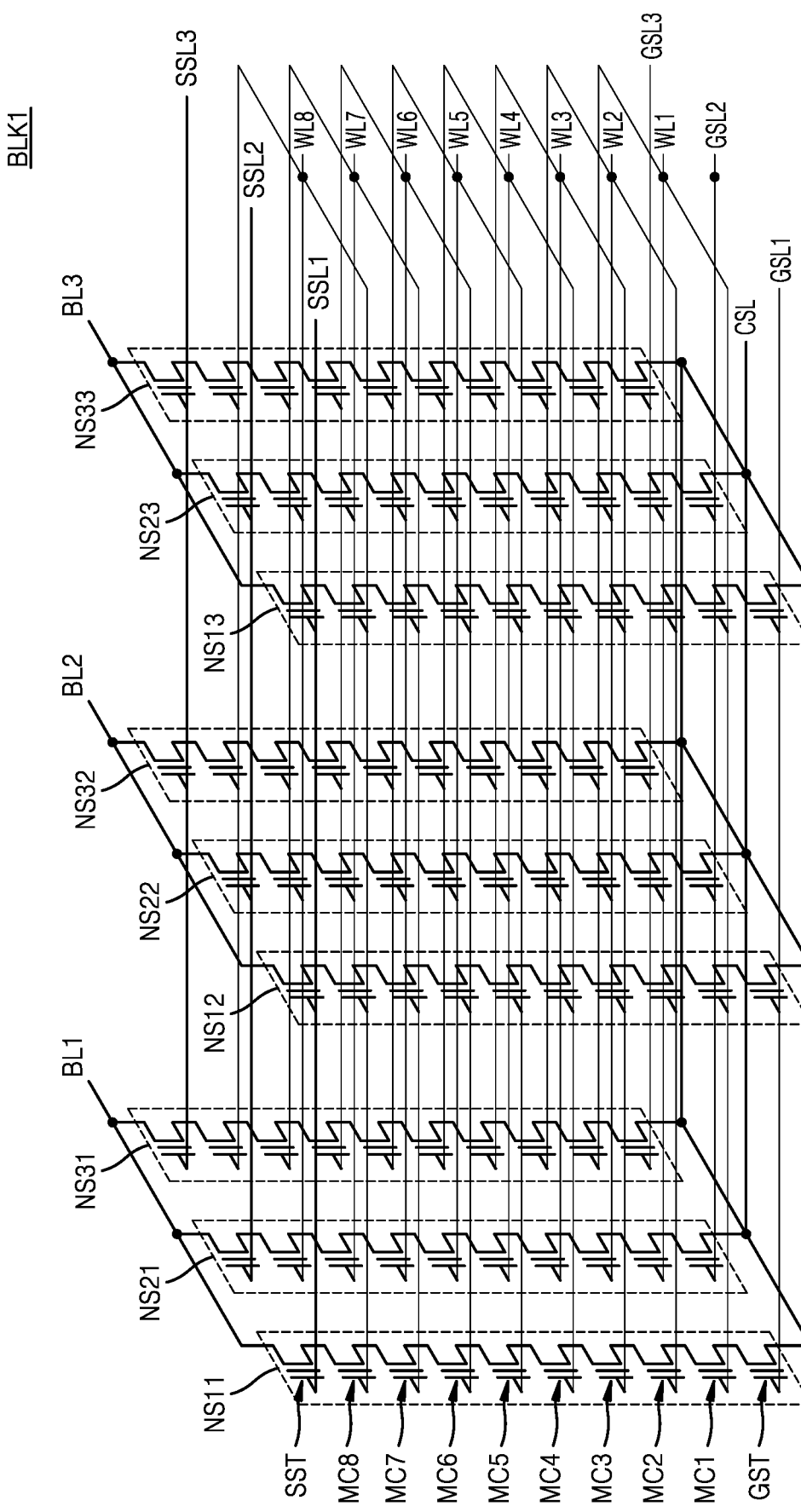
FIG. 5 is a circuit diagram showing an equivalent circuit of a first memory block from among the memory blocks of FIG. 2 according to an embodiment of the present inventive concept.

FIG. 5 is a circuit diagram showing an equivalent circuit of a first memory block from among the memory blocks of FIG. 2.

Referring to FIG. 5, the first memory block BLK1 may be a NAND flash memory having a vertical structure, and each of the memory blocks BLK1 to BLKz shown in FIG. 2 may be implemented as shown in FIG. 5. The first memory block BLK1 may include a plurality of NAND cell strings NS11 to NS33, the word lines WL1 to WL8, the bit lines BL1 to BL3, a plurality of ground select lines GSL1 to GSL3, a plurality of string select lines SSL1 to SSL3, and the common source line CSL. However, embodiments of the present inventive concept are not necessarily limited thereto and the number of NAND cell strings, the number of word lines, the number of bit lines, the number of ground select lines, and the number of string select lines may vary from those shown in FIG. 5.

NAND cell strings NS11, NS21, and NS31 are provided between a first bit line BL1 and the common source line CSL, NAND cell strings NS12, NS22, and NS32 are provided between a second bit line BL2 and the common source line CSL, and NAND cell strings NS13, NS23, and NS33 are provided between a third bit line BL3 and the common source line CSL. In an embodiment, each NAND cell string (e.g., NS11) may include a string select transistor SST, a plurality of memory cells MC1 to MC8, and a ground select transistor GST that are coupled in series.

NAND cell strings commonly coupled to one bit line may constitute one column. For example, the NAND cell strings NS11, NS21, and NS31 commonly coupled to the first bit line BL1 may correspond to a first column, the NAND cell strings NS12, NS22, and NS32 commonly coupled to the second bit line BL2 may correspond to a second column, and the NAND cell strings NS13, NS23, and NS33 commonly coupled to the third bit line BL3 may correspond to a third column.

NAND cell strings coupled to one string select line may constitute one row. For example, NAND cell strings NS11, NS12, and NS13 coupled to a first string select line SSL1 may correspond to a first row, NAND cell strings NS21, NS22, and NS23 coupled to a second string select line SSL2 may correspond to a second row, and NAND cell strings NS31, NS32, and NS33 coupled to a third string select line SSL3 may correspond to a third row.

The string select transistor SST may be coupled to corresponding string select lines SSL1 to SSL3. The memory cells MC1 to MC8 may be coupled to corresponding word lines WL1 to WL8, respectively. The ground select transistor GST may be connected to the corresponding ground select lines GSL1 to GSL3, and the string select transistor SST may be connected to the corresponding bit lines BL1 to BL3. The ground select transistor GST may be connected to the common source line CSL.

According to an embodiment, word lines of the same height (e.g., WL1) are coupled to each other in common, the string select lines SSL1 to SSL3 are separated from one another, and the ground select lines GSL1 to GSL3 are also separated from one another. For example, when programming memory cells coupled to a first word line WL1 and belonging to the NAND cell strings NS11, NS12, and NS13 corresponding to a first column, the first word line WL1 and the first string select line SSL1 are selected. However, embodiments of the present inventive concept are not necessarily limited thereto, and, according to an embodiment, the ground select lines GSL1 to GSL3 may be connected to one another in common.

Figure 6:
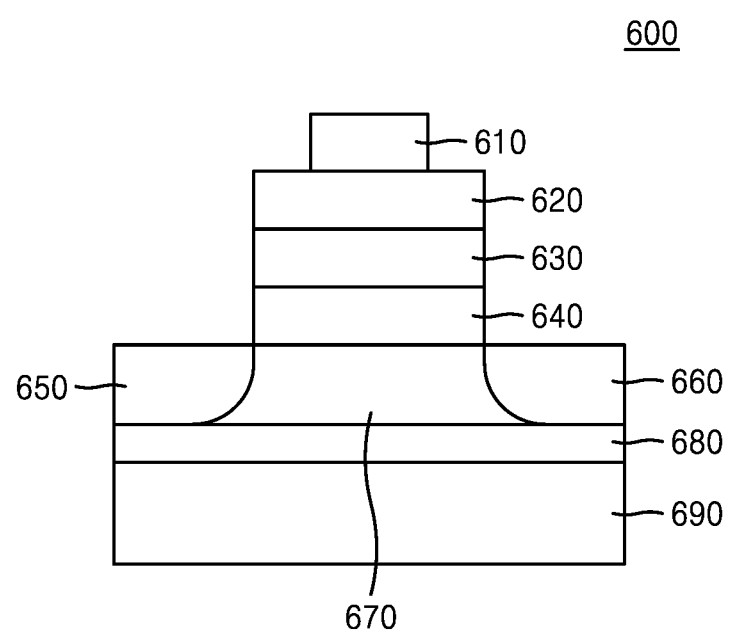
FIG. 6 is a cross-sectional view of a non-volatile memory cell according to an embodiment of the present inventive concept.

FIG. 6 is a cross-sectional view of a non-volatile memory cell according to an embodiment.

Referring to FIG. 6, a non-volatile memory cell 600 includes a control gate 610, a blocking layer 620, a first semiconductor layer 630, a tunneling layer 640, and a source 650, a drain 660, a second semiconductor layer 670, a buried oxide (BOX) layer 680, and a substrate 690.

When program/erase operations are repeated on the non-volatile memory cell 600, an unwanted trap site may be formed in the tunneling layer 640. Therefore, charges trapped in the first semiconductor layer 630 may escape through the tunneling layer 640, and thus data may be lost. This phenomenon is called vertical charge migration in a direction perpendicular to a channel layer. In a non-volatile memory having a three-dimensional structure, since a plurality of cells constituting one string share the first semiconductor layer 630, charge migration may occur toward adjacent cells, such as lateral charge migration. Due to the charge migration, the data retention characteristics of a semiconductor device degrades, and thus the reliability of the memory device deteriorates. For example, the charge migration phenomenon becomes more significant as the process becomes finer, e.g., when multi-bit technology is implemented in one cell to increase device integration. Therefore, there is a growing need to reduce the reliability degradation of a non-volatile memory device itself.

A non-volatile memory device according to an embodiment may have a substrate having an SOI structure. For example, a bias voltage is applied to the substrate 690 to prevent leakage of data (e.g., charge carriers) stored in the second semiconductor layer 670. The BOX layer 680 is formed on the substrate 690 and prevents leakage of data stored in the second semiconductor layer 670. In an embodiment, the BOX layer 680 may include a material having low thermal conductivity, such as $SiO_2$, $Al_2O_3$, $HfO_2$, etc. In an embodiment, the second semiconductor layer 670 may include silicon, and, in this embodiment the second semiconductor layer 670 and the BOX layer 680 may include an SOI.

In an embodiment, the tunneling layer 640 may include, for example, a silicon oxide layer. The first semiconductor layer 630 may include a silicon nitride film or a high-k film having a higher dielectric constant. For example, the first semiconductor layer 630 may include a $Si_3N_4$ film, a metal oxide film, a metal nitride film, or a combination thereof. Here, the first semiconductor layer 630 includes a trap site that stores charges passing through the tunneling layer 640. The first semiconductor layer 630 may be referred to as a charge trapping layer.

The blocking layer 620 blocks electrons from escaping to the control gate 610 in the process of being trapped at the trap site of the first semiconductor layer 630 and blocking charges of the control gate 610 from being injected into the first semiconductor layer 630. In an embodiment in which the first semiconductor layer 630 includes a nitride, a tunneling insulation layer, a first data storage layer, and a blocking insulation layer may have an ONO structure. The control gate 610 may include at least one material selected from a group consisting of TaN, TiN, W, WN, HfN, and tungsten silicide. The control gate 610 may be connected to a corresponding word line and a program voltage may be applied thereto, and the drain 660 may be connected to a corresponding bit line.

Figure 7A:
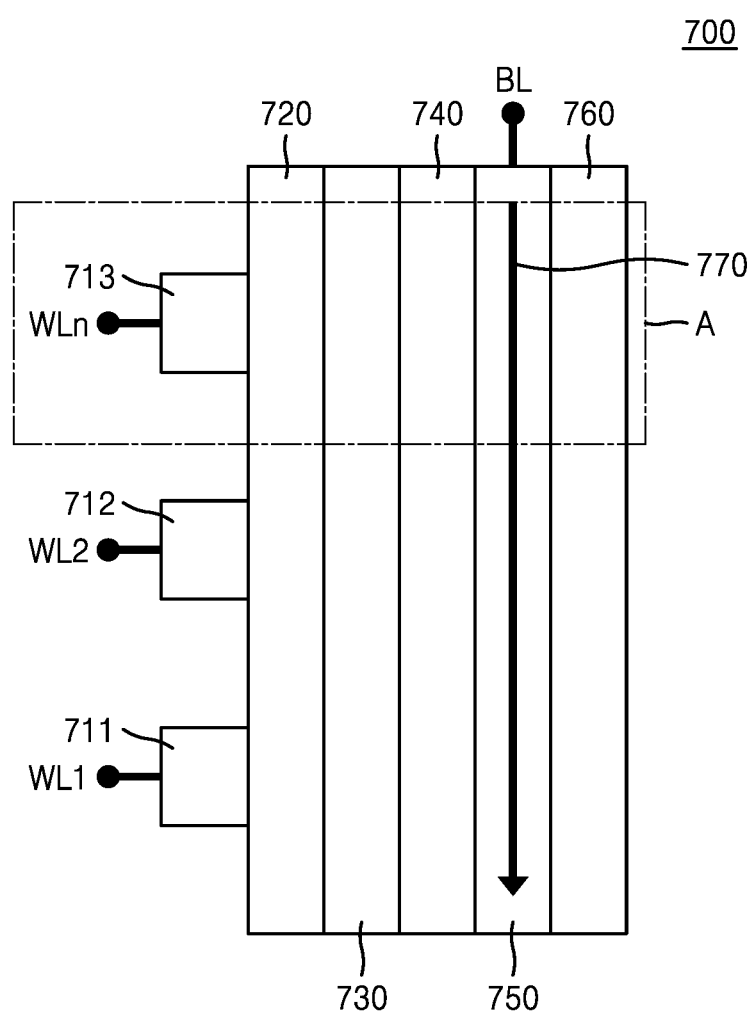
FIGS. 7A to 7C are cross-sectional views showing that a recovery operation is performed according to embodiments of the present inventive concept.
Figure 7B:
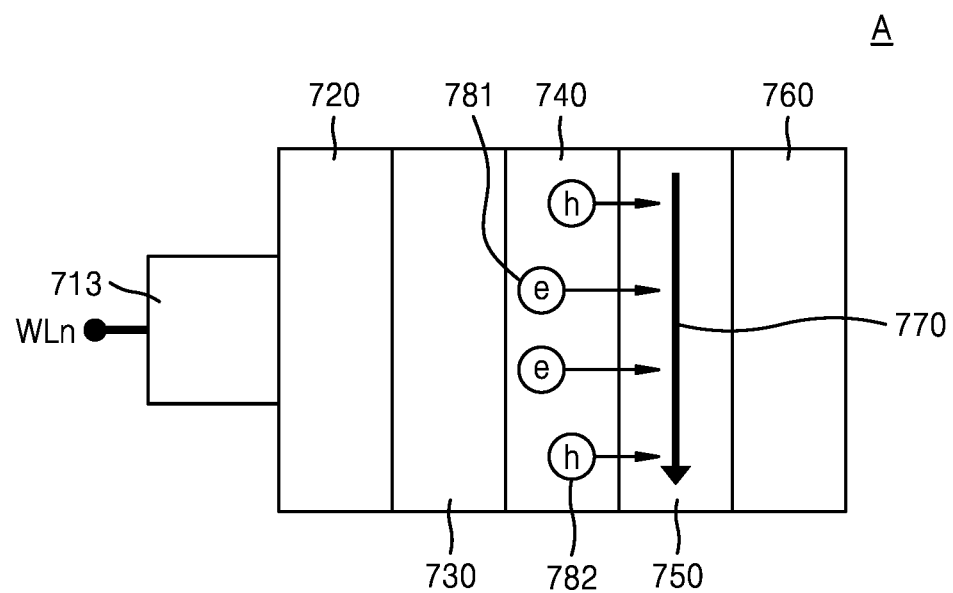
Figure 7C:
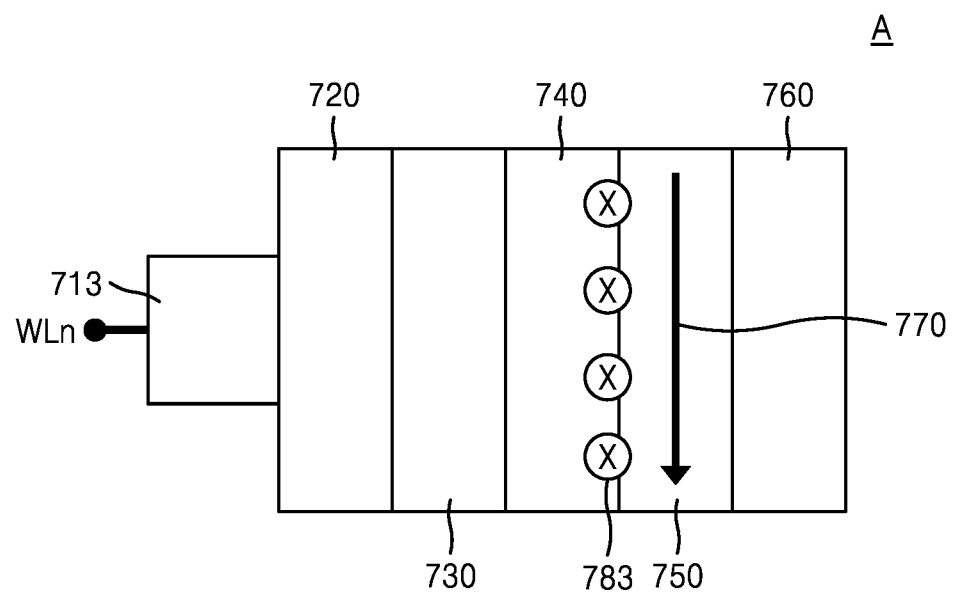

FIGS. 7A to 7C are cross-sectional views showing that a recovery operation is performed according to embodiments of the present inventive concept.

FIG. 7A is a cross-sectional view showing non-volatile memory cells according to an embodiment form a string structure. FIG. 7A may show an example of an operation for self-curing of a memory device, such as a recovery operation, according to an embodiment. A memory cell string of FIG. 7A may be a part of a memory block of which reliability is degraded as the degradation counts accumulate.

Referring to FIG. 7A, a memory cell string 700 includes control gates 711, 712, and 713, a blocking layer 720, a first semiconductor layer 730, a tunneling layer 740, a second semiconductor layer 750, and a BOX layer 760. For example, in an embodiment the first semiconductor layer 730 may be a charge trapping layer, and the second semiconductor layer 750 may be a channel polysilicon. Hereinafter, FIG. 7A will be described with reference to FIGS. 1 and 2.

According to an embodiment, a word line voltage may be applied through word lines WL1, WL2, and WLn connected to the control gates 711, 712, and 713, respectively. A bit line voltage may be applied through the bit line BL connected to the second semiconductor layer 750. Although three word lines WL1, WL2, and WLn are shown in FIG. 7A, embodiments of the present inventive concept are not necessarily limited thereto and there may be more or fewer word lines.

According to an embodiment, the memory device 100 may receive a first command from the memory controller 10 to perform a recovery operation and may then perform the recovery operation. For example, the first command may be a recovery command. When the recovery operation is performed, the first voltage V1 may be applied to the word lines WL1, WL2, and WLn, and the second voltage V2 may be applied to the bit line BL. A recovery current 770 may flow along a channel of the memory cell string 700 by the first voltage V1 and the second voltage V2. Joule heat is generated in a memory device by the recovery current 770, and the memory device may recover reliability degradation by using the Joule heat. Detailed descriptions thereof are given below with reference to FIGS. 7B and 7C.

According to an embodiment, the first voltage V1 applied to word lines may be greater than or equal to a turn-on voltage for turning on memory cells or a pass voltage and may be greater than or equal to a voltage applied during the program operation. The second voltage V2 applied to bit lines may be a voltage higher than voltages applied during a program operation, an erase operation, a read operation, and a pre-charge operation. The first voltage V1 and the second voltage V2 may be different from each other. For example, the memory device 100 may perform a recovery operation by applying the first voltage V1 higher than a turn-on voltage to word lines and applying the second voltage V2 higher than a voltage applied during a program operation, a read operation, or an erase operation to a bit line. For example, the memory device 100 may perform a recovery operation by applying the first voltage V1 higher than a turn-on voltage to word lines and applying the second voltage V2 higher than a pre-charge voltage to a bit line.

FIG. 7B shows a portion of the cross-section of the memory string shown in FIG. 7A. For example, FIG. 7B may show a portion A of FIG. 7A. Hereinafter, descriptions identical to those already given above with reference to FIG. 7A may be omitted for economy of description, and FIG. 7B will be described with reference to FIGS. 1, 2, and 7A.

FIG. 7B shows trapped electrons 781 and trapped holes 782 that are trapped in the tunneling layer 740 as program/erase operations are repeated on a memory block.

According to an embodiment, a recovery current 770 may flow along the second semiconductor layer 750 by the first voltage V1 applied to word lines and the second voltage V2 applied to a bit line. Joule heat is generated by the recovery current 770, and the Joule heat may anneal out the trapped electrons 781 and the trapped holes 782. As the trapped electrons 781 and the trapped holes 782 escape from the tunneling layer 740, degradation of the data retention characteristics of the memory device 100 may be reduced.

FIG. 7C shows a portion of the cross-section of the memory string shown in FIG. 7A. For example, FIG. 7C may show a portion A of FIG. 7A. Hereinafter, descriptions identical to those already given above with reference to FIG. 7A are omitted, and FIG. 7C will be described with reference to FIGS. 1, 2, and 7A.

FIG. 7C shows that unwanted trap sites 783 are formed in the tunneling layer 740 as program/erase operations are repeated on the memory block.

According to an embodiment, the recovery current 770 flows along the second semiconductor layer 750 by the first voltage V1 applied to a word line WLn and the second voltage V2 applied to the bit line BL. Joule-heat is generated by the recovery current 770, and the Joule heat may remove the trap sites 783. As the trap sites 783 are removed and charges trapped in the first semiconductor layer 730 escape through the tunneling layer 740, degradation of the data retention characteristics of the memory device 100 may be reduced.

Figure 8:
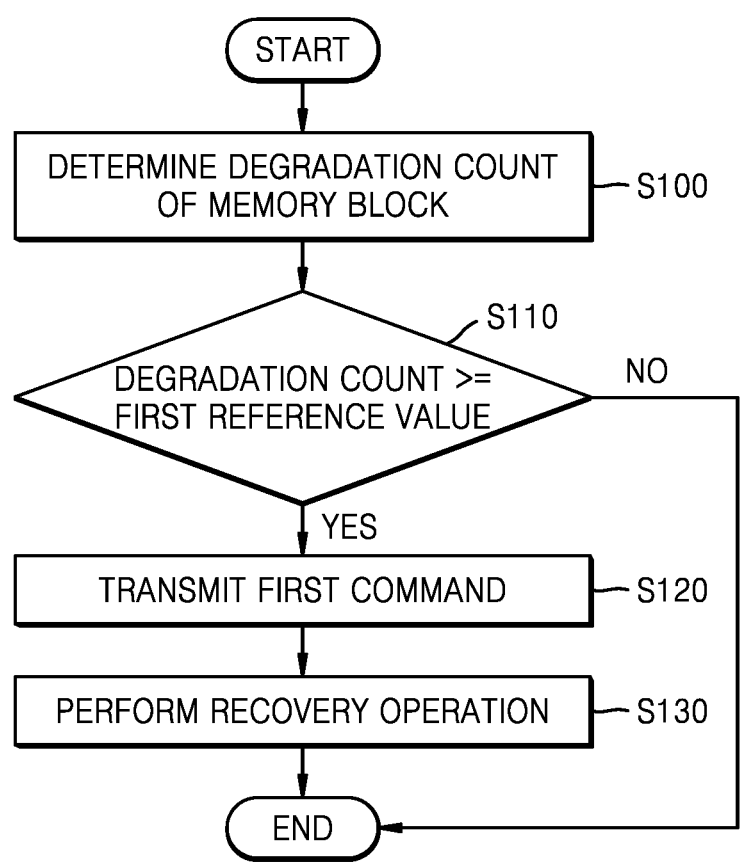
FIG. 8 is a flowchart of a method of operating a memory system for performing a recovery operation, according to an embodiment of the present inventive concept.

FIG. 8 is a flowchart of a method of operating a memory system for performing a recovery operation, according to an embodiment. FIG. 8 may be described below with reference to FIG. 1. According to an embodiment, operations S100 to S130 may be performed during the idle time of the memory device 100, such as a period of time in which data is not being read or programmed on the memory device 100.

Referring to FIG. 8, in operation S100, the memory controller 10 may determine respective degradation counts of a plurality of memory blocks of the memory device 100. According to an embodiment, a degradation count may be a program/erase count for a memory block indicating the number of times a program/erase operation was performed by the memory block, a read count for a memory block indicating a number of times a read operation was performed by the memory block, or an error bit count indicating a number of error bits of data read from a memory block. However, embodiments of the present inventive concept are not necessarily limited thereto, and a degradation count may be various pieces of information indicating degradation of a memory block.

In operation S110, the memory controller 10 may compare the degradation counts with the first reference value to determine whether the memory block of the memory device 100 is degraded. Information regarding the first reference value serving as a criterion for determining degradation may be stored in the block management module 11. In an embodiment, when a degradation count is determined to be less than the first reference value, a recovery operation may not be performed. When a degradation count is determined to be greater than or equal to the first reference value, operation S120 may be performed. However, embodiments of the present inventive concept are not necessarily limited thereto. For example, in an embodiment, operation S120 may only be performed when the degradation count is determined to be greater than the first reference value. When the degradation count is determined to be equal to the first reference value, operation S120 may not be performed.

In operation S120, the memory controller 10 may transmit a first command to the memory device 100 together with an address of a first memory block, such that the memory device 100 may perform a recovery operation on the first memory block. According to an embodiment, the first command may be a recovery command.

In operation S130, the memory device 100 may perform a recovery operation in response to the first command received from the memory controller 10. An example of operation S130 of recovering a memory block is described in detail below with reference to FIG. 9.

In an embodiment, the memory controller 10 may initialize a degradation count of a memory block after performing a recovery operation thereon. The memory controller 10 may include (e.g., store) initialization count information regarding initialization counts of memory blocks and information regarding a reference initialization count. As the degradation count of the first memory block is initialized, the memory controller 10 may update the initialization count information. According to an embodiment, when the initialization count reaches the reference initialization count, the first memory block may be determined to be (e.g., set as) a bad block.

Figure 9:
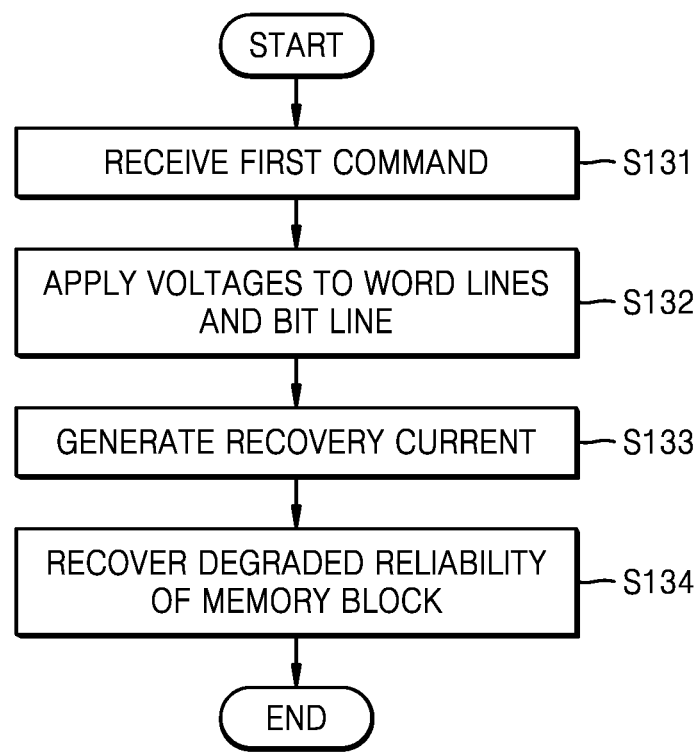
FIG. 9 is a flowchart of operation S130 of FIG. 8 in detail according to an embodiment of the present inventive concept.

FIG. 9 is a flowchart of operation S130 of FIG. 8 in detail.

In operation S131, the memory device 100 may receive the first command from the memory controller 10. In operation S132, the memory device 100 may apply the first voltage V1 to word lines of the first memory block and apply the second voltage V2 to a bit line of the first memory block to perform a recovery operation on the first memory block. In operation S133, the recovery current 770 may flow along a channel of a memory cell string by the first voltage V1 and the second voltage V2. In operation S134, Joule heat is generated in a memory device by the recovery current 770, and the first memory block may recover reliability degradation by using the Joule heat. Therefore, the degraded reliability of the first memory block may be recovered.

Figure 10:
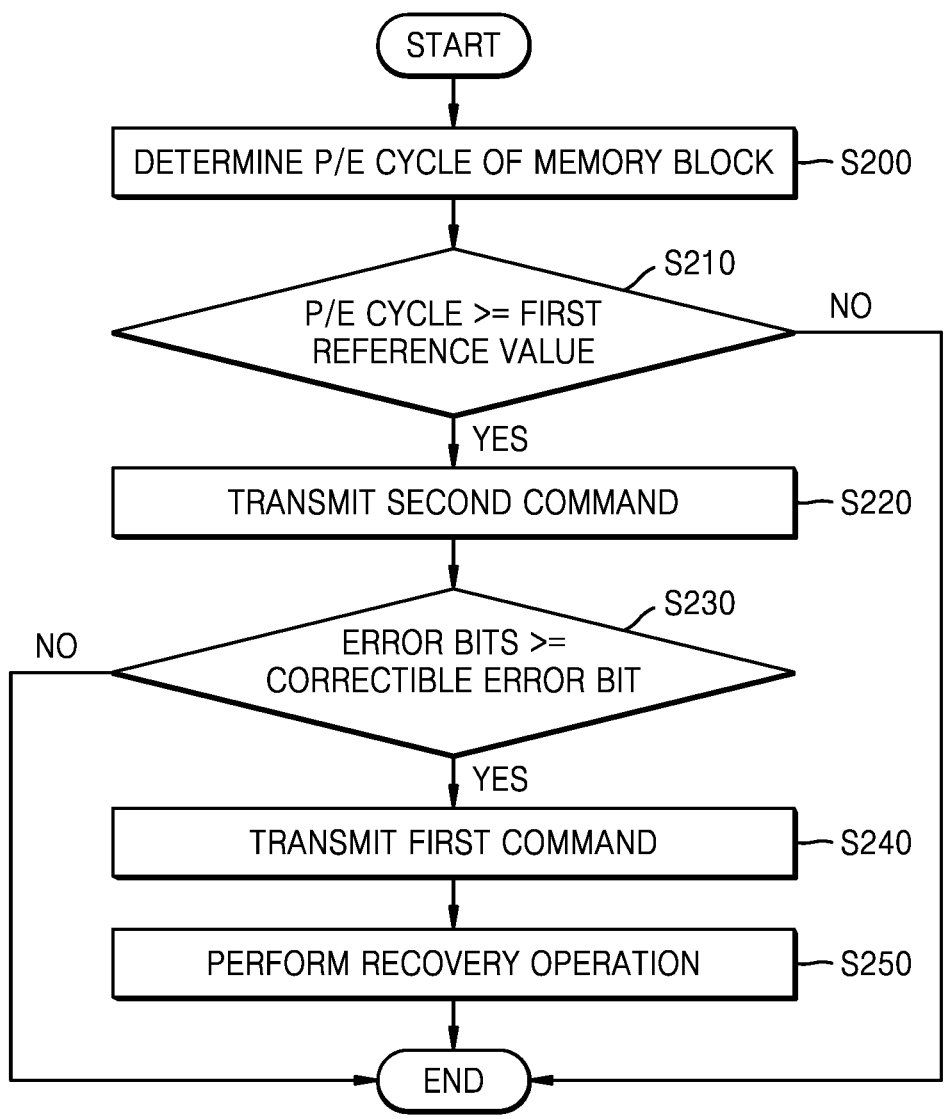
FIG. 10 is a flowchart of a method of operating a memory system for performing a recovery operation, according to an embodiment of the present inventive concept.

FIG. 10 is a flowchart of a method of operating a memory system for performing a recovery operation, according to an embodiment. Hereinafter, descriptions identical to those already given above with reference to FIGS. 8 and 9 will be omitted, and FIG. 10 will be described with reference to FIGS. 1, 8, and 9.

Referring to FIG. 10, in operation S200, the memory controller 10 may check respective program/erase cycles ("PIE cycle" in FIG. 10) of a plurality of memory blocks of the memory device 100. In operation S210, to determine whether the memory blocks of the memory device 100 are degraded, the memory controller 10 may compare the number of program/erase cycles with the first reference value, thereby detecting degraded memory blocks. When the number of the program/erase cycle is less than the first reference value, a recovery operation may not be performed. When the number of the program/erase cycle is greater than or equal to the first reference value, operation S220 may be performed.

In operation S220, the memory controller 10 may transmit a second command to the memory device 100 to count the number of error bits of a memory block having a program/erase cycle greater than or equal to the first reference value.

In operation S230, in response to the second command, the memory device 100 may transmit data stored in a first memory block to the memory controller 10. The ECC engine 12 included in the memory controller 10 may detect an error by counting the number of error bits of data read from the memory device 100 by using an error correction code and correct the error. When the number of errors is greater than or equal to the number of correctable error bits, error bit correction may fail, and operation S240 may be performed. When the number of errors is less than the number of correctable error bits, error correction may be successful, and a recovery operation may not be performed. According to some embodiments, in operation S230, the memory device 100 may count the numbers of the error bits of memory blocks and transmit the numbers of error bits to the memory controller 10. The memory controller 10 may compare the numbers of error bits with a reference number.

In operation S240, the memory controller 10 may transmit a first command to the memory device 100. According to an embodiment, the first command may be a recovery command.

In operation S250, the memory device 100 may perform a recovery operation in response to the first command received from the memory controller 10.

Figure 11:
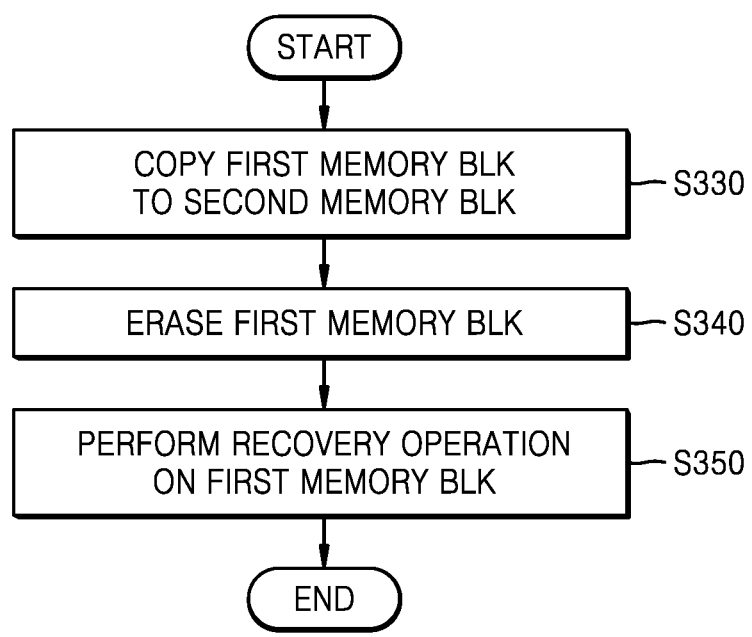
FIG. 11 is a flowchart of a method that may be performed after operation S120 of FIG. 8 according to an embodiment of the present inventive concept.
Figure 12A:
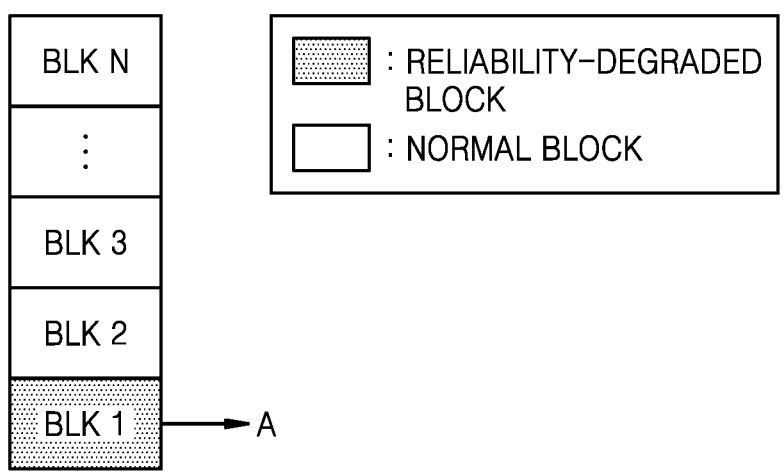
FIGS. 12A to 12E are flowcharts for describing operations S330 to S350 of FIG. 11 in detail according to embodiments of the present inventive concept.
Figure 12B:
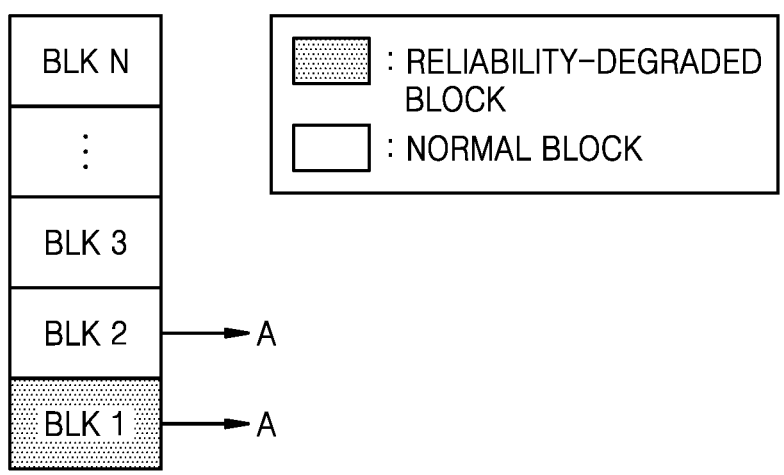
Figure 12C:
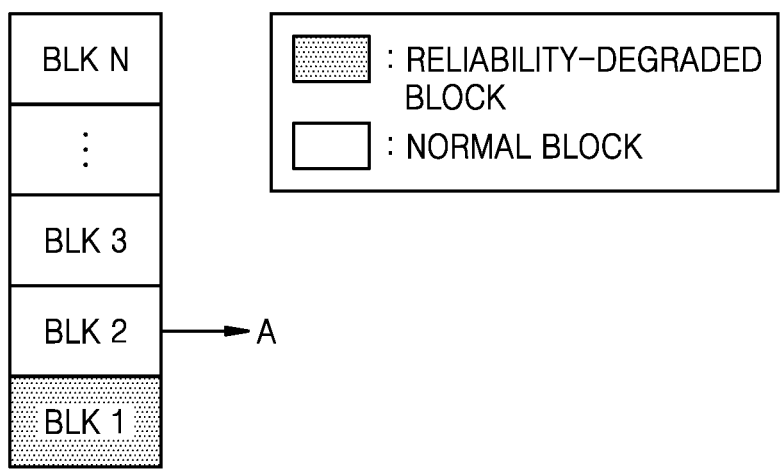
Figure 12D:
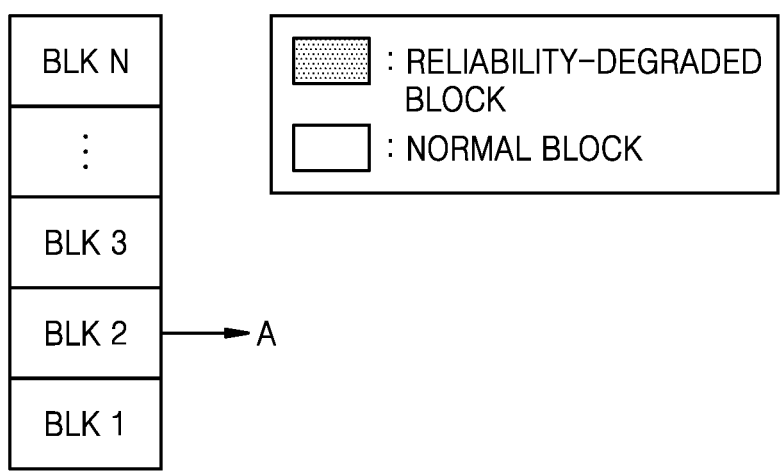
Figure 12E:
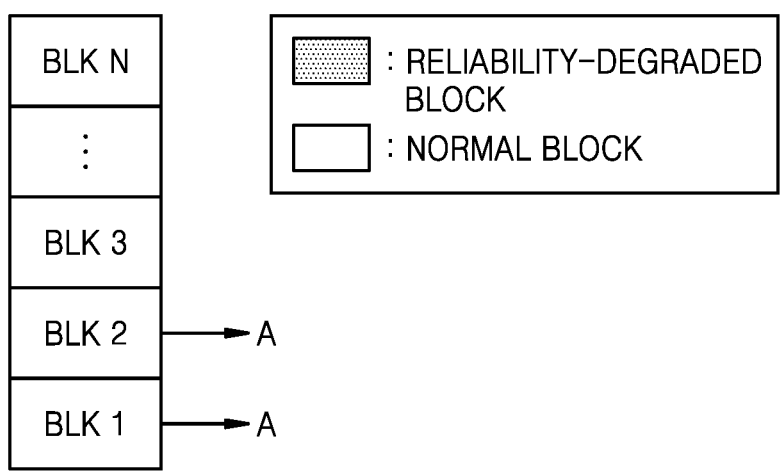

FIG. 11 is a flowchart of an embodiment that may be performed after operation S120 of FIG. 8. FIGS. 12A to 12E are flowcharts for describing operations S330 to S350 of FIG. 11 in detail.

Hereinafter, descriptions identical to those already given above with reference to FIGS. 8 and 9 may be omitted for economy of description. FIG. 11 will be described with reference to FIGS. 1, 2, and 12A to 12E.

Referring to FIG. 11, in operation S330, a first memory block BLK 1 may be a memory block with degraded reliability. For example, referring to FIG. 12A, the degradation count of the first memory block BLK 1 may be greater than or equal to a reference value (e.g., a first reference value). Therefore, the memory controller 10 may determine the first memory block BLK 1 to be a memory block that needs a recovery operation. Data A may be stored in the first memory block BLK1 before the recovery operation is performed.

In operation S330, the memory device 100 may copy data of the first memory block BLK 1 and store it on a second memory block BLK 2 that may be a normal block without reliability degradation. For example, referring to FIG. 12B, the memory device 100 may copy the data A of the first memory block BLK 1 and store it on the second memory block BLK 2. In an embodiment, after the data A of the first memory block BLK 1 is copied to and stored on the second memory block BLK 2, the memory controller 10 may update a mapping table, such that a physical address mapped with a logical address of the data A is re-mapped from a physical address of the first memory block BLK 1 to a physical address of the second memory block BLK 2.

In operation S340, the memory device 100 may erase data stored in the first memory block BLK 1. For example, referring to FIG. 12C, the memory device 100 may erase the data A stored in the first memory block BLK 1.

In operation S350, the memory device 100 may perform a recovery operation on the first memory block BLK 1. For example, referring to FIG. 12D, the memory device 100 may perform a recovery operation on the first memory block BLK 1.

In an embodiment, after operation S350, the memory device 100 may copy the data. A stored in the second memory block BLK 2 and store data A in the first memory block BLK 1. For example, referring to FIG. 12E, the memory device 100 may copy the data A that has been copied to the second memory block BLK 2 to the first memory block BLK 1 on which a recovery operation has been completed.

Figure 13:
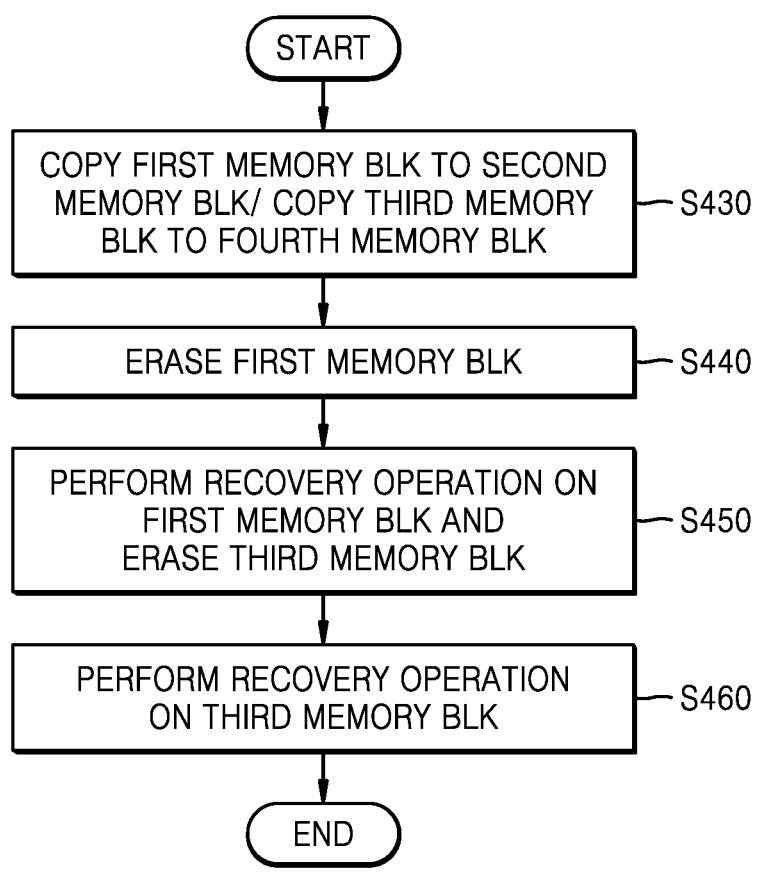
FIG. 13 is a flowchart of an embodiment that may be performed after operation S120 of FIG. 8 according to an embodiment of the present inventive concept.
Figure 14A:
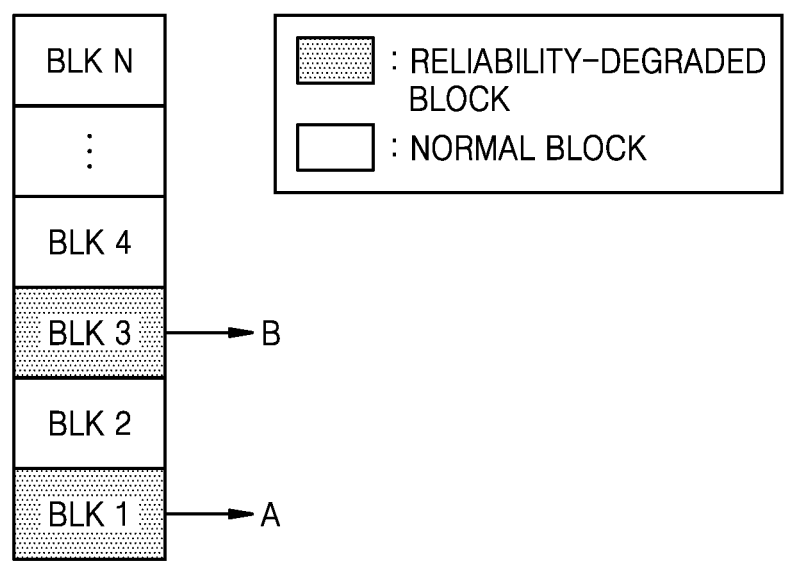
FIGS. 14A to 14E are flowcharts for describing operations S430 to S460 of FIG. 13 in detail according to embodiments of the present inventive concept.
Figure 14B:
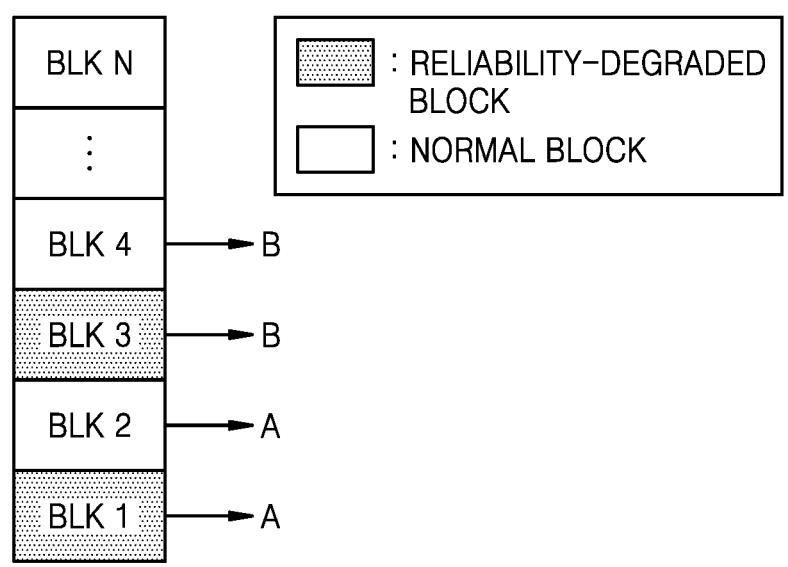
Figure 14C:
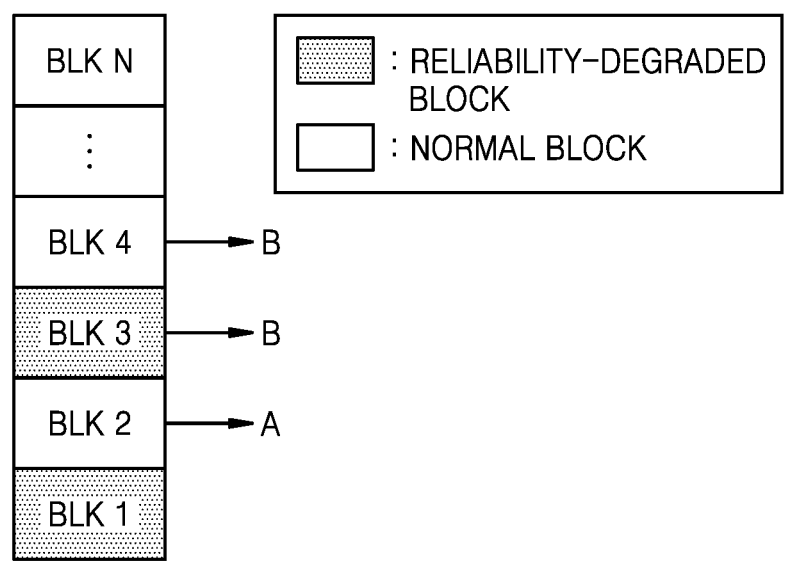
Figure 14D:
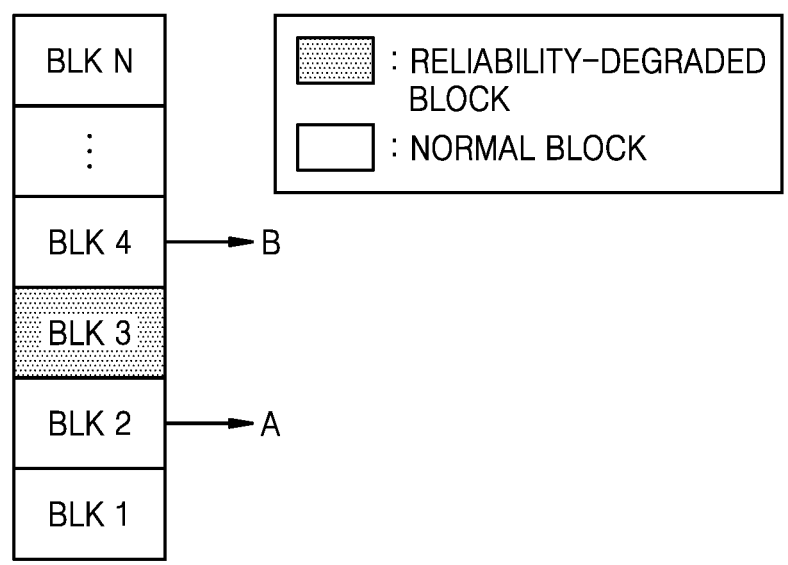
Figure 14E:
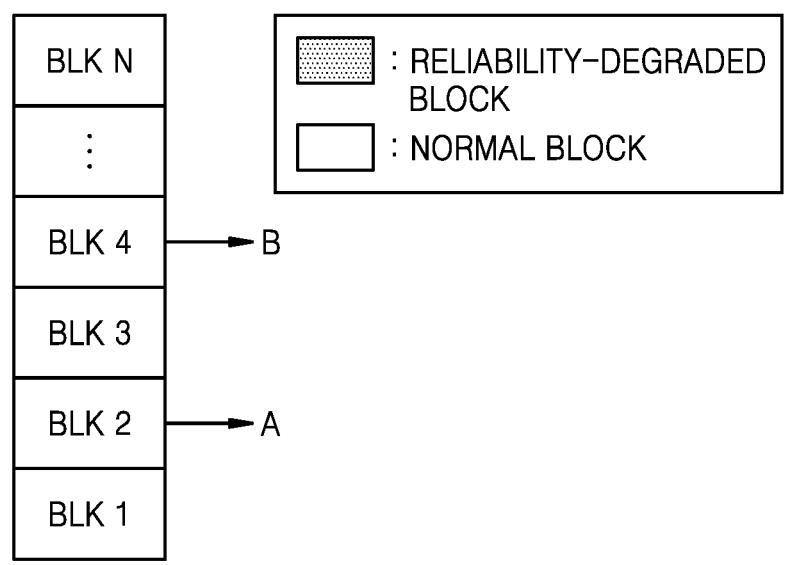

FIG. 13 is a flowchart of an embodiment that may be performed after operation S120 of FIG. 8. FIGS. 14A to 14E are flowcharts for describing operations S430 to S460 of FIG. 13 in detail.

Hereinafter, descriptions identical to those already given above with reference to FIGS. 8 and 9 may be omitted for economy of description. FIG. 13 will be described with reference to FIGS. 1, 2, and 14A to 14E.

Referring to FIG. 13, in operation S430, the first memory block BLK 1 and a third memory block BLK 3 may be memory blocks with degraded reliability. For example, referring to FIG. 14A, degradation counts of the first memory block BLK 1 and the third memory block BLK 3 may be greater than or equal to the first reference value. The memory controller 10 may determine the first memory block BLK 1 and the third memory block BLK 3 as memory blocks that need a recovery operation performed thereon. Before the recovery operation is performed, data A may be stored in the first memory block BLK 1, and data B may be stored in the third memory block BLK 3.

In operation S430, the memory device 100 may copy data of the first memory block BLK 1 and store it on the second memory block BLK 2, and may copy data of the third memory block BLK 3 and store it on a fourth memory block BLK 4. For example, referring to FIG. 14B, the memory device 100 may copy the data A of the first memory block BLK 1 and store it on the second memory block BLK 2 and copy the data B of the third memory block BLK 3 and store it on the fourth memory block BLK 4. In an embodiment, after the data A of the first memory block BLK 1 is copied and stored on the second memory block BLK 2, the memory controller 10 may update a mapping table, such that a physical address mapped with a logical address of the data A is re-mapped from a physical address of the first memory block BLK 1 to a physical address of the second memory block BLK 2. Likewise, after the data B of the third memory block BLK 3 is copied and stored on the fourth memory block BLK 4, the memory controller 10 may update a mapping table, such that a physical address mapped with a logical address of the data B is re-mapped from a physical address of the third memory block BLK 3 to a physical address of the fourth memory block BLK 4.

In operation S440, the memory device 100 may erase data of the first memory block BLK 1. For example, referring to FIG. 14C, the memory device 100 may erase the data A of the first memory block BLK 1.

In an embodiment, in operation S450, the memory device 100 may erase data of the third memory block BLK 3 simultaneously while performing a recovery operation on the first memory block BLK 1. For example, referring to FIG. 14D, the memory device 100 may perform a recovery operation on the first memory block BLK 1. At the same time, the memory device 100 may erase the data B of the third memory block BLK 3.

In operation S460, the memory device 100 may perform a recovery operation on the third memory block BLK 3. For example, referring to FIG. 14E, the memory device 100 may perform a recovery operation on the third memory block BLK 3.

Figure 15:
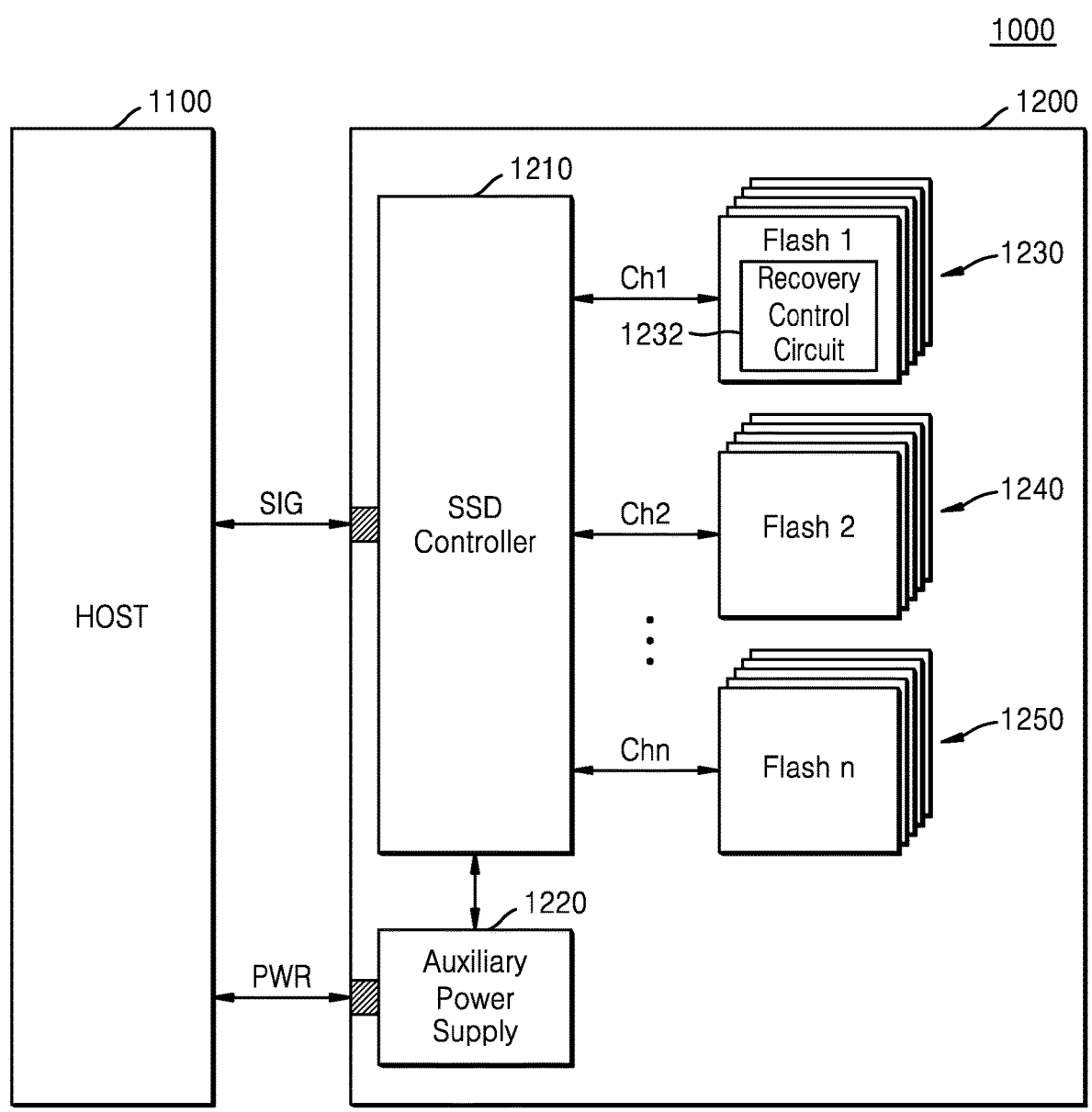
FIG. 15 is a block diagram showing a memory device that is applied to a solid state drive (SSD) system according to an embodiment of the present inventive concept.

FIG. 15 is a block diagram showing an example in which a memory device according to an embodiment is applied to an SSD system.

Referring to FIG. 15, an SSD system 1000 may include a host 1100 and an SSD 1200. The SSD 1200 may exchange signals with the host 1100 through a signal connector and may receive power through a power connector. The SSD 1200 may include an SSD controller 1210, an auxiliary power supply device 1220, and a plurality of memory devices, such as Flash 1 1230, Flash 2 1240 and Flash n 1250 in which n is an integer greater than or equal to 3. Here, the SSD 1200 may be implemented according to embodiments described above with reference to FIGS. 1 to 14E. Therefore, the memory devices 1230, 1240, and 1250 may each perform a recovery operation. In an embodiment, a first reference value serving as a criterion for determining whether a recovery operation is needed may differ from one memory device to another. The memory devices 1230, 1240, and 1250 may each include a recovery control circuit 1232, and thus, voltages for a recovery operation may be applied to word lines and a bit line of a memory block to be recovered during a recovery operation. Therefore, the reliability of the data retention characteristics of the SSD system 1000 may be increased.

Figure 16:
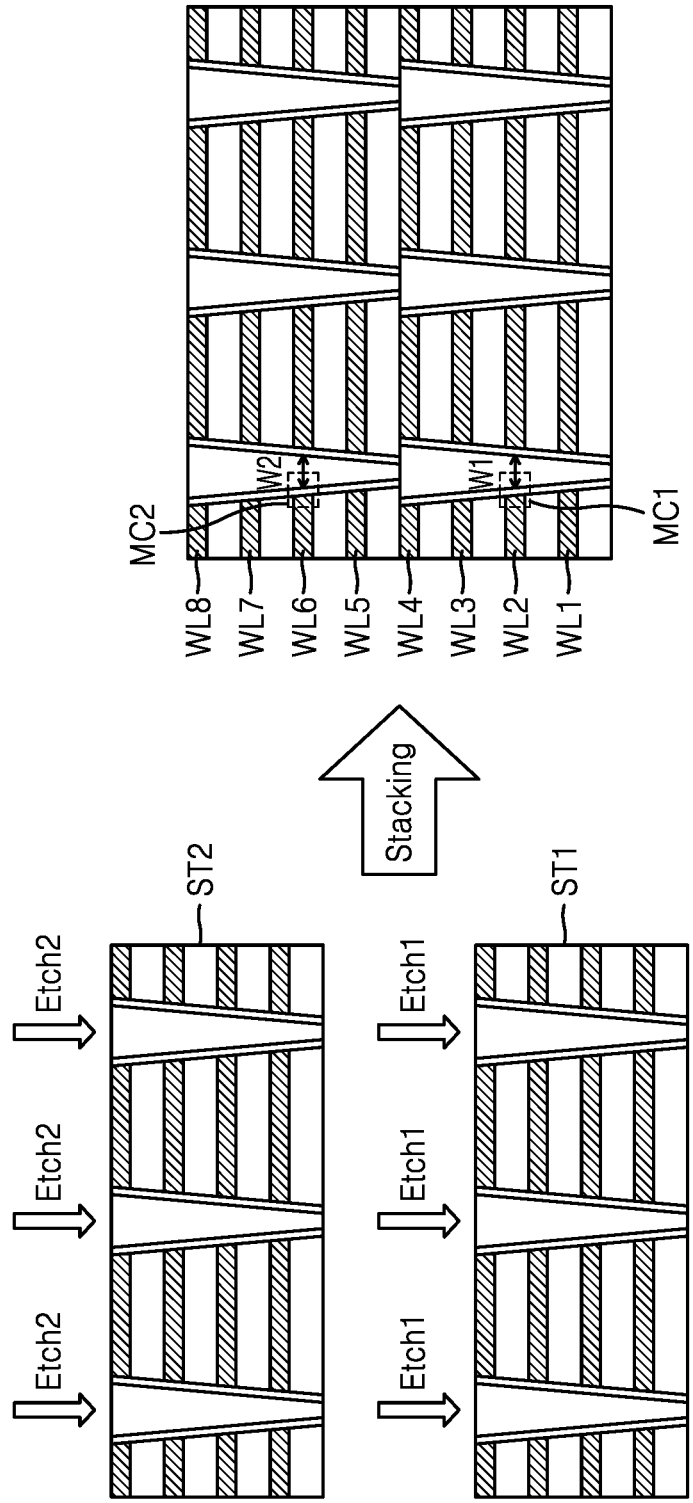
FIG. 16 is a diagram showing a method of forming a memory cell array, according to an embodiment of the present inventive concept.

FIG. 16 is a diagram showing a method of forming a memory cell array, according to an embodiment. In detail, FIG. 16 shows a cross-section obtained along a line A-A' of FIG. 4. Descriptions already given above with reference to FIG. 4 may be omitted for economy of description.

Referring to FIG. 16, the first memory stack ST1 may be formed on a plurality of layers formed by the method described above with reference to FIG. 4 through a first etching Etch1. Also, the second memory stack ST2 may be formed through a second etching Etch2 on a plurality of layers formed independently from the first memory stack ST1. The first memory stack ST1 and the second memory stack ST2 may be stacked to be vertically aligned to share channel holes with each other. The first memory stack ST1 may include a first memory cell MC1 connected to a second word line WL2, and the second memory stack ST2 may include a second memory cell MC2 connected to a sixth word line WL6.

Since the first memory stack ST1 and the second memory stack ST2 are formed through the same formation process including the same etching process, widths W1 and W2 of channel holes included in memory cells (e.g., MC1 and MC2) at the same height may form similar profiles to each other. According to an embodiment, a first width W1 of channel holes included in the first memory cell MC1 may be the same as or similar to a second width W2 of channel holes included in the second memory cell MC2. Therefore, various operations of the first memory cell MC1 and the second memory cell MC2 may be similar.

Figure 17:
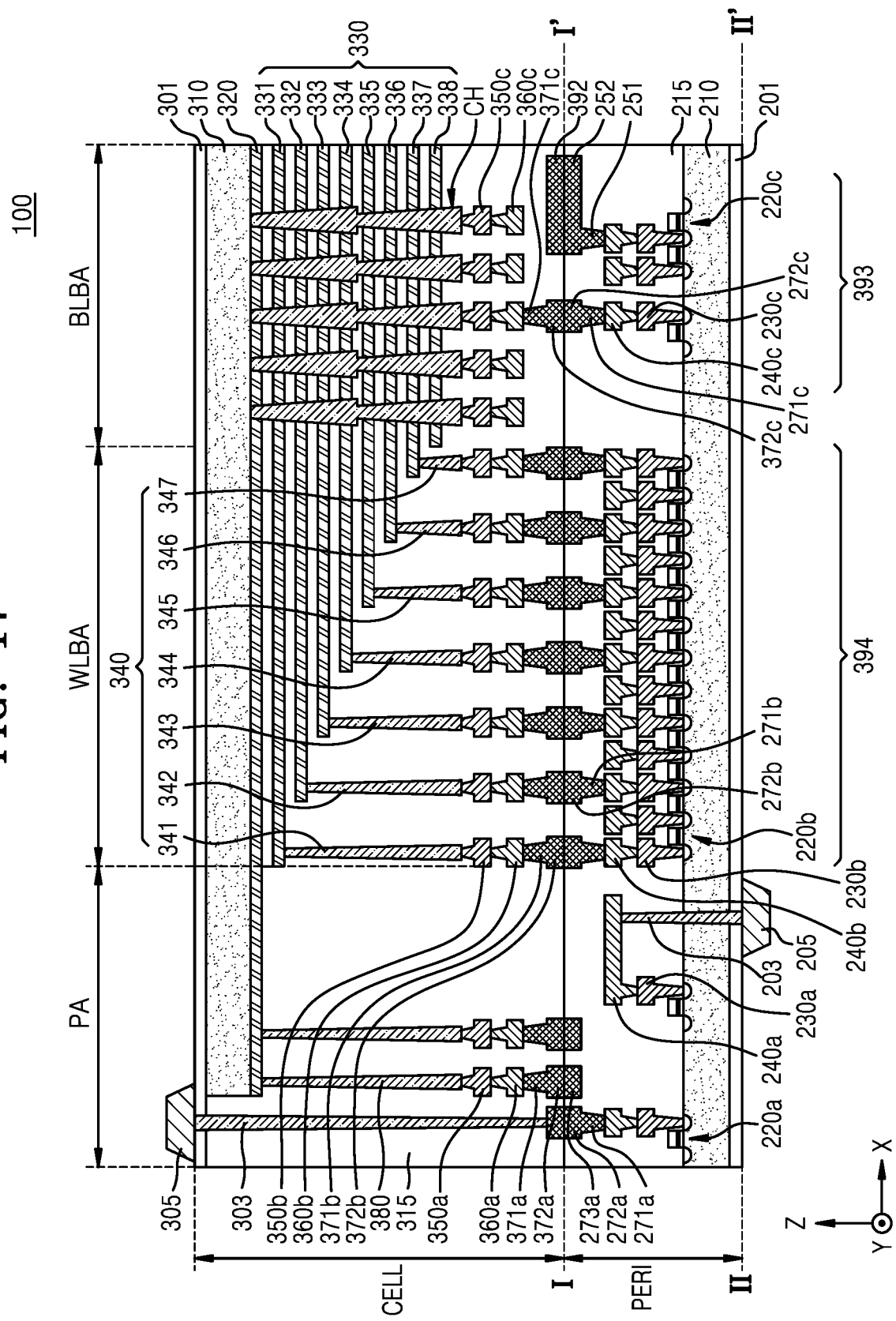
FIG. 17 is a diagram for describing a BVNAND structure that may be applied according to an embodiment of the present inventive concept.

FIG. 17 is a diagram for describing a BVNAND structure that may be applied to an embodiment of the present inventive concept.

Referring to FIG. 17, the memory device 100 may have a chip-to-chip (C2C) structure. The C2C structure may refer to a structure formed by fabricating an upper chip including a cell region CELL on a first wafer, fabricating a lower chip including a peripheral circuit region PERI on a second wafer different from the first wafer, and connecting the upper chip and the lower chip to each other through bonding. For example, the bonding may refer to an electric connection between a bonding metal formed on an uppermost metal layer of the upper chip and a bonding metal formed on an uppermost metal layer of the lower chip. For example, when the bonding metal includes copper (Cu), the bonding may be a Cu—Cu bonding, and the bonding metal may also include aluminum (Al) or tungsten (W).

The peripheral circuit region PERI and the cell region CELL of the memory device 100 may each include an external pad bonding area PA, a word line bonding area WLBA, and a bit line bonding area BLBA.

The peripheral circuit region PERI may include a first substrate 210, an interlayer insulation layer 215, a plurality of circuit elements 220a, 220b, and 220c formed on the first substrate 210, first metal layers 230a, 230b, and 230c respectively connected to the circuit elements 220a, 220b, and 220c, and second metal layers 240a, 240b, and 240c respectively formed on the first metal layers 230a, 230b, and 230c. According to an embodiment, the first metal layers 230a, 230b, and 230c may include tungsten having relatively high electrical resistivity, whereas the second metal layers 240a, 240b, and 240c may include copper having relatively low electrical resistivity.

Although only the first metal layers 230a, 230b, and 230c and the second metal layers 240a, 240b, and 240c are shown and described in the present specification, embodiments of the present inventive concept are not necessarily limited thereto, and one or more metal layers may be further formed on the second metal layers 240a, 240b, and 240c. At least some of the one or more metal layers formed on the second metal layers 240a, 240b, and 240c may include a material such as aluminum having a lower electrical resistivity than copper constituting the second metal layers 240a, 240b, and 240c.

The interlayer insulation layer 215 is provided on the first substrate 210 to cover the circuit elements 220a, 220b, and 220c, the first metal layers 230a, 230b, and 230c, and the second metal layers 240a, 240b, and 240c and may include an insulation material such as a silicon oxide or a silicon nitride.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically connected to upper bonding metals 371b and 372b in the cell region CELL through bonding, wherein the lower bonding metals 271b and 272b and the upper bonding metals 371b and 372b may include aluminum, copper, or tungsten.

The cell region CELL may provide at least one memory block. The cell region CELL may include a second substrate 310 and a common source line 320. On the second substrate 310, a plurality of word lines 331 to 338 and 330 may be stacked in a direction perpendicular to the top surface of the second substrate 310 (e.g., a Z-axis direction). String select lines and a ground select line may be arranged on top and bottom of the word lines 330, and the word lines 330 may be arranged between the string select lines and the ground select line.

In the bit line bonding area BLBA, a channel structure CH may extend in a direction (e.g., the Z-axis direction) perpendicular to the top surface of the second substrate 310 and penetrate through the word lines 330, the string select lines, and the ground select line. The channel structure CH may include a data storage layer, a channel layer, and a buried insulation layer, and the channel layer may be electrically connected to a first metal layer 350c and a second metal layer 360c. For example, the first metal layer 350c may be a bit line contact, and the second metal layer 360c may be a bit line (hereinafter, referred to as "bit line"). In an embodiment, the bit line 360c may extend in a first direction parallel to the top surface of the second substrate 310 (e.g., a Y-axis direction).

In an embodiment shown in FIG. 17, a region in which the channel structure CH and the bit line 360c are arranged may be defined as the bit line bonding area BLBA. The bit line 360c may be electrically connected to circuit elements 220c, which provide a page buffer 393 in the peripheral circuit region PERI, in the bit line bonding area BLBA. For example, the bit line 360c is connected to the upper bonding metals 371c and 372c in the peripheral circuit region PERI, and the upper bonding metals 371c and 372c may be connected to the lower bonding metals 271c and 272c that are connected to the circuit elements 220c of the page buffer 393.

In the word line bonding area WLBA, the word lines 330 may extend in a second direction (e.g., a X-axis direction) perpendicular to the first direction (e.g., the Y-axis direction) and parallel to the top surface of the second substrate 310 and may be connected to a plurality of cell contact plugs 341 to 347 and 340. The word lines 330 and the cell contact plugs 340 may be connected to each other at pads provided by at least some of the word lines 330 extending to different lengths in the second direction. A first metal layer 350b and a second metal layer 360b may be sequentially connected to the top of the cell contact plugs 340 connected to the word lines 330. In the word line bonding area WLBA, the cell contact plugs 340 may be connected to the peripheral circuit region PERI through the upper bonding metals 371b and 372b in the cell region CELL and the lower bonding metals 271b and 272b in the peripheral circuit region PERI The cell contact plugs 340 may be electrically connected to the circuit elements 220b that provide a row decoder 394 in the peripheral circuit region PERI. In an embodiment, an operating voltage of the circuit elements 220b forming the row decoder 394 may be different from an operating voltage of the circuit elements 220c forming the page buffer 393. For example, the operating voltage of the circuit elements 220c forming the page buffer 393 may be greater than the operating voltage of the circuit elements 220b forming the row decoder 394.

A common source line contact plug 380 may be provided in the external pad bonding area PA. The common source line contact plug 380 includes a conductive material like a metal, a metal compound, or polysilicon and may be electrically connected to the common source line 320. A first metal layer 350a and a second metal layer 360a may be sequentially stacked on the common source line contact plug 380. For example, an area in which the common source line contact plug 380, the first metal layer 350a, and the second metal layer 360a are arranged may be defined as the external pad bonding area PA.

In an embodiment, first and second input/output pads 205 and 305 may be arranged in the external pad bonding area PA. Referring to FIG. 17, a lower insulation layer 201 covering the bottom surface of the first substrate 210 may be formed below the first substrate 210, and first input/output pads 205 may be formed on the lower insulation layer 201. The first input/output pad 205 is connected to at least one of the circuit elements 220a, 220b, and 220c arranged in the peripheral circuit region PERI through a first input/output contact plug 203 and may be separated from the first substrate 210 by a lower insulation layer 201. Also, a side insulation film may be provided between the first input/output contact plug 203 and the first substrate 210 to electrically separate the first input/output contact plug 203 from the first substrate 210.

In FIG. 17, an upper insulation film 301 covering the top surface of the second substrate 310 may be formed on the second substrate 310, and a second input/output pad 305 may be provided on the upper insulation film 301. The second input/output pad 305 may be connected to at least one of the circuit elements 220a, 220b, and 220c arranged in the peripheral circuit region PERI through a second input/output contact plug 303. According to an embodiment, the second input/output pad 305 may be electrically connected to the circuit element 220a.

According to an embodiment, the second substrate 310 and the common source line 320 may not be arranged in an area where the second input/output contact plug 303 is provided. Also, the second input/output pad 305 may not overlap the word lines 330 in the third direction (e.g., the Z-axis direction). Referring to FIG. 17, the second input/output contact plug 303 is separated from the second substrate 310 in a direction parallel to the top surface of the second substrate 310 and may penetrate through the interlayer insulation layer 315 in the cell region CELL and may be connected to the second input/output pad 305.

According to an embodiment, the first input/output pad 205 and the second input/output pad 305 may be selectively formed. For example, the memory device 100 may include only the first input/output pad 205 provided on the first substrate 210 or only the second input/output pad 305 provided on the second substrate 310. Alternatively, the memory device 100 may include both the first input/output pad 205 and the second input/output pad 305.

In each of the external pad bonding area PA and the bit line bonding area BLBA included in each of the cell region CELL and the peripheral circuit region PERI, a metal pattern of an uppermost metal layer may exist as a dummy pattern or the uppermost metal layer may be omitted.

In the memory device 100, in the external pad bonding area PA, in correspondence to an upper metal pattern 372a formed on the uppermost metal layer in the cell region CELL, a lower metal pattern 273a having the same shape as the upper metal pattern 372a in the cell region CELL may be formed on the uppermost metal layer in the peripheral circuit region PERI. The lower metal pattern 273a formed on the uppermost metal layer in the peripheral circuit region PERI may not be connected to a separate contact in the peripheral circuit region PERI. Similarly, in the external pad bonding area PA, in correspondence to the lower metal pattern 273a formed on the uppermost metal layer in the peripheral circuit region PERI, the upper metal pattern 372a having the same shape as the lower metal pattern 273a in the peripheral circuit region PERI may be formed on the uppermost metal layer in the cell region CELL.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically connected to upper bonding metals 371b and 372b in the cell region CELL through bonding.

Also, in the bit line bonding area BLBA, in correspondence to a lower metal pattern 252 formed on the uppermost metal layer in the peripheral circuit region PERI, an upper metal pattern 392 having the same shape as the lower metal pattern 252 may be formed on the uppermost metal layer in the cell region CELL. A contact may not be formed on the upper metal pattern 392 formed on the uppermost metal layer in the cell region CELL.

While the present inventive concept has been particularly shown and described with reference to non-limiting embodiments thereof, it will be understood that various changes in form and details may be made therein without departing from the spirit and scope of the following claims.

What is claimed is:

1. A method of operating a memory system that comprises a memory device including a plurality of memory blocks and a memory controller, the method comprising:
   detecting a first memory block having a degradation count greater than or equal to a first reference value from among the plurality of memory blocks by the memory controller;
   transmitting a first command for the first memory block to the memory device by the memory controller; and
   performing a recovery operation by applying a first voltage to all of a plurality of word lines connected to the first memory block and a second voltage to a bit line connected to the first memory block in response to the first command by the memory device, wherein:
   the first voltage is greater than a voltage applied to turn on memory cells connected to all of the plurality of word lines connected to the first memory block; and
   the second voltage is greater than a voltage applied to the bit line during a program operation, a read operation, or an erase operation performed on the memory device.

2. The method of claim 1, wherein the recovery operation is performed during an idle time of the memory device.

3. The method of claim 1, wherein the degradation count is program-erase counts for the plurality of memory blocks or error bit counts obtained from the plurality of memory blocks.

4. The method of claim 3, wherein the detecting of the first memory block having the degradation count greater than or equal to the first reference value comprises:
   transmitting a second command for requesting data stored in the first memory block to the memory device by the memory controller;
   transmitting the data to the memory controller by the memory device; and
   counting error bits of the data by the memory controller.

5. The method of claim 3, further comprising:
   detecting a second memory block having a degradation count that is greater than or equal to a second reference value from among the plurality of memory blocks by the memory controller; and
   setting the second memory block as a bad block by the memory controller, wherein the second reference value is greater than the first reference value.

6. The method of claim 1, further comprising:
   before performing the recovery operation, copying first data stored on the first memory block and storing the first data on a second memory block from among the plurality of memory blocks; and
   erasing the first data stored on the first memory block.

7. The method of claim 6, further comprising:
   detecting a third memory block having the degradation count greater than or equal to the first reference value from among the plurality of memory blocks;
   copying second data stored on the third memory block and storing the second data on a fourth memory block from among the plurality of memory blocks;
   erasing the second data stored on the third memory block while the recovery operation is performed on the first memory block; and performing a second recovery operation on the third memory block by applying the first voltage to all of a plurality of word lines connected to the third memory block and the second, voltage to a bit line connected to the third memory block by the memory device.

8. The method of claim 1, wherein:
the plurality of memory blocks comprises a first memory stack and a second memory stack; and
the first memory stack and the second memory stack are formed through independent channel hole generation processes, respectively.

9. The method of claim 6, further comprising, after the first data is copied and stored on the second memory block, updating a physical address mapped with a logical address for the first data from a physical address of the first memory block to a physical address of the second memory block.

10. The method of claim 1, further comprising initializing the degradation count of the first memory block by the memory controller.

11. The method of claim 10, further comprising setting the first memory block as a bad block based on whether an initialization count of the degradation count is greater than or equal to a reference number.

12. A memory device comprising:
a memory cell array comprising a plurality of memory blocks, each of the plurality of memory blocks comprising a plurality of memory cells, a plurality of word lines respectively connected to the plurality of memory blocks, and a plurality of bit lines respectively connected to the plurality of memory blocks; and
a control circuit controlling the memory device to perform a control operation on a first memory block from among the plurality of memory blocks,
wherein, during the control operation, the control circuit:
copies first data stored on the first memory block from among the plurality of memory blocks and stores the first data on a second memory block from among the plurality of memory blocks and erases the first data stored on the first memory block,
applies a first voltage to some selected word lines from among a plurality of word lines connected to the first memory block and applies a second voltage to a bit line connected to the first memory block among the plurality of bit lines,
controls the first voltage to be greater than a voltage applied to turn on memory cells connected to the some selected word lines from among the word lines connected to the first memory block, and
controls the second voltage to be greater than a voltage applied to the bit line during a program operation, a read operation, or an erase operation performed on the memory cell array.

13. The memory device of claim 12, wherein the memory cells of the memory device have a silicon-on-insulator structure.

14. The memory device of claim 12, wherein the each of the plurality of memory blocks comprises:

a first memory stack comprising a plurality of first memory cells; and
a second memory stack comprising a plurality of second memory cells that is formed through a channel hole formation process independent from the first memory stack and vertically stacked on the first memory stack.

15. A memory system comprising:
a memory device comprising a plurality of memory blocks; and
a memory controller transmitting commands to control the memory device, wherein:
in response to the commands, the memory device copies first data stored on a first memory block from among the plurality of memory blocks and stores the first data on a second memory block from among the plurality of memory blocks, erases the first data stored on the first memory block, applies a first voltage to all of word lines connected to the first memory block, and applies a second voltage to a bit line connected to the first memory block, wherein:
the first voltage is greater than a voltage applied to turn on memory cells connected to all of the word lines connected to the first memory block; and
the second voltage is greater than a voltage applied to the bit line during a pre-charging operation for the memory device.

16. The memory system of claim 15, wherein the memory controller selects a memory block having a degradation count greater than or equal to a reference value from among the plurality of memory blocks as the first memory block and provides an address of the first memory block to the memory device.

17. The memory system of claim 16, wherein the reference value differs from one memory block to another memory block of the plurality of memory blocks.

18. The memory system of claim 15, wherein each of the plurality of memory blocks comprises:
a first memory stack comprising a plurality of first memory cells; and
a second memory stack comprising a plurality of second memory cells formed through a channel hole formation process independent from the first memory stack and vertically stacked on the first memory stack.

19. The memory system of claim 16, wherein the memory controller determines error bits of the first memory block after detecting the first memory block having a degradation count greater than or equal to the reference value.

20. The memory system of claim 15, wherein each of the plurality of memory blocks comprises:
an upper substrate;
a plurality of gate conductive layers stacked on the upper substrate and respectively connected to word lines; and
a plurality of channel layers penetrating through the gate conductive layers and extending in a direction perpendicular to a top surface of the upper substrate.

* * * * *